(12) United States Patent
Otsu et al.

(10) Patent No.: US 8,808,874 B2
(45) Date of Patent: Aug. 19, 2014

(54) ORGANIC ELECTROLUMINESCENT ELEMENT, ILLUMINATOR AND DISPLAY

(75) Inventors: Shinya Otsu, Hino (JP); Masato Nishizeki, Hachioji (JP); Eisaku Katoh, Hachioji (JP); Tomohiro Oshiyama, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 775 days.

(21) Appl. No.: 11/444,590

(22) Filed: Jun. 1, 2006

(65) Prior Publication Data

US 2006/0280966 A1 Dec. 14, 2006

(30) Foreign Application Priority Data

Jun. 9, 2005 (JP) .................................. 2005-169227

(51) Int. Cl.
*H01L 51/54* (2006.01)
*C09K 11/06* (2006.01)

(52) U.S. Cl.
USPC ........... 428/690; 428/917; 313/504; 313/506; 257/40; 257/102; 257/103; 257/E51.044; 548/101

(58) Field of Classification Search
USPC .................................. 548/108; 257/E51.041
See application file for complete search history.

(56) References Cited

U.S. PATENT DOCUMENTS

| | | |
|---|---|---|
| 6,660,410 B2 | 12/2003 | Hosokawa |
| 6,863,997 B2 | 3/2005 | Thompson et al. |
| 6,921,915 B2 | 7/2005 | Takiguchi et al. |
| 6,939,624 B2 | 9/2005 | Lamansky et al. |
| 7,227,027 B2 | 6/2007 | Qiu et al. |
| 7,332,233 B2 | 2/2008 | Park et al. |
| 7,381,479 B2 | 6/2008 | Lamansky et al. |
| 7,553,560 B2 | 6/2009 | Lamansky et al. |
| 2002/0094453 A1 | 7/2002 | Takiguchi et al. |
| 2002/0100906 A1 | 8/2002 | Takiguchi et al. |
| 2003/0085646 A1 | 5/2003 | Takiguchi et al. |
| 2004/0086745 A1 | 5/2004 | Iwakuma et al. |
| 2004/0110031 A1 | 6/2004 | Fukuda et al. |
| 2004/0115476 A1* | 6/2004 | Oshiyama et al. ............ 428/690 |
| 2005/0116626 A1* | 6/2005 | Cheng et al. ................. 313/504 |
| 2005/0158578 A1* | 7/2005 | Iwakuma et al. ............. 428/690 |
| 2006/0008670 A1* | 1/2006 | Lin et al. ....................... 428/690 |
| 2006/0022588 A1 | 2/2006 | Tsuboyama et al. |
| 2006/0051613 A1 | 3/2006 | Tomita et al. |
| 2006/0197077 A1* | 9/2006 | Okuda et al. .................... 257/40 |
| 2006/0257684 A1 | 11/2006 | Arakane et al. |
| 2007/0200124 A1 | 8/2007 | Suzuri et al. |

FOREIGN PATENT DOCUMENTS

| | | |
|---|---|---|
| JP | 2002-226495 | 8/2002 |
| JP | 2002-234894 | 8/2002 |
| JP | 2002-332291 | 11/2002 |
| JP | 2002-332292 | 11/2002 |
| JP | 2002-338588 | 11/2002 |
| JP | 2003-109758 A | 4/2003 |
| JP | 2003-133074 A | 5/2003 |
| JP | 2003-317946 A | 11/2003 |
| JP | 2004-71380 | 3/2004 |
| JP | 2004-178895 | 6/2004 |
| JP | 2004-178896 | 6/2004 |
| JP | 2004-273128 | 9/2004 |
| JP | 2004-273389 | 9/2004 |
| JP | 2004-288380 | 10/2004 |
| JP | 2004-311404 | 11/2004 |

(Continued)

OTHER PUBLICATIONS

Combined Search and Examination Report for Application No. GB1103738.9 dated Mar. 18, 2011.

(Continued)

*Primary Examiner* — Michael H Wilson
(74) *Attorney, Agent, or Firm* — Holtz Holtz Goodman & Chick PC

(57) ABSTRACT

An organic electroluminescent element containing an anode and a cathode having therebetween a light emitting layer, wherein the light emitting layer contains a guest compound having a substructure represented by Formula (AA): wherein A represents a group of atoms necessary to form an aromatic hydrocarbon ring or an aromatic heterocycle, B represents a group of atoms necessary to form a 5-membered aromatic heterocycle containing nitrogen or a 5-membered heterocycle containing nitrogen and M represents Ir or Pt, and a host compound represented by Formula (1):

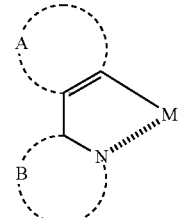

Formula (AA)

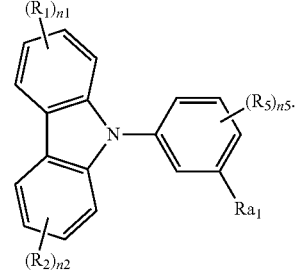

Formula (1)

11 Claims, 4 Drawing Sheets

(56) References Cited

FOREIGN PATENT DOCUMENTS

| | | |
|---|---|---|
| JP | 2004-335427 | 11/2004 |
| JP | 2005-47811 | 2/2005 |
| JP | 2005-053912 A | 3/2005 |
| JP | 2005-68110 | 3/2005 |
| JP | 2005-104971 A | 4/2005 |
| JP | 2005-514754 A | 5/2005 |
| JP | 2005-163036 A1 | 6/2005 |
| WO | WO 01/39234 A2 | 5/2001 |
| WO | WO 01/41512 A1 | 6/2001 |
| WO | WO 02/15645 | 2/2002 |
| WO | WO 03/080761 A1 * | 2/2003 ............ C09K 11/06 |
| WO | WO 03/059015 A1 | 7/2003 |
| WO | WO 2004/074399 A1 | 9/2004 |
| WO | WO 2005/007767 | 1/2005 |
| WO | WO 2005/007767 A2 * | 1/2005 |
| WO | WO 2006/009024 A1 | 1/2006 |

OTHER PUBLICATIONS

Japanese Office Action drafted on Oct. 14, 2011 (and English translation thereof) in counterpart Japanese Application No. 2007-520029.

Japanese Office Action drafted on Aug. 27, 2012 (and English translation thereof) in counterpart Japanese Application No. 2007-520029.

R.J. Holmes et al, "Blue organic electrophosphorescence using exothermic host-guest energy transfer", Applied Physics Letters, Apr. 14, 2003, pp. 2422-2424, vol. 82, No. 15.

Notice which issued on Jun. 11, 2013 for corresponding Japanese application JP 2011-268592.

Notice of Reasons for Refusal which issued on Jul. 12, 2013 for corresponding Japanese application JP 2011-268592.

* cited by examiner

LIGHT

LIGHT

ORGANIC ELECTROLUMINESCENT ELEMENT, ILLUMINATOR AND DISPLAY

This application is based on Japanese Patent Application No. 2005-169227 filed on Jun. 9, 2005, in Japanese Patent Office, the entire content of which is hereby incorporated by reference.

FIELD OF THE INVENTION

The present invention relates to an organic electroluminescent element, as well as an illuminator and a display employing the same.

BACKGROUND OF THE INVENTION

As an emission type electronic display device, an electroluminescent device (ELD) is known. Elements constitution the ELD include an inorganic electroluminescent element and an organic electroluminescent element (hereinafter referred to also as an organic EL element). Inorganic electroluminescent element has been used for a plane light source, however, a high voltage alternating current has been required to drive the element. An organic EL element has a structure in which a light emitting layer containing a light emitting compound is arranged between a cathode and an anode, and an electron and a hole were injected into the light emitting layer and recombined to form an exciton. The element emits light, utilizing light (fluorescent light or phosphorescent light) generated by inactivation of the exciton, and the element can emit light by applying a relatively low voltage, namely, several volts to several tens of volts. The element has a wide viewing angle and a high visuality since the element is of self light emission type. Further, the element is a thin, complete solid element, therefore, the element is noted from the viewpoint of space saving and portability.

For the practical use in the future, an organic EL element is desired to emit light of high luminance with high efficiency at a lower power.

For example, disclosed is an organic EL element exhibiting higher luminance of emitting light with longer life in which a stilbene derivative, a distyrylarylene derivative or a tristyrylarylene derivative doped with a slight amount of a fluorescent compound is employed (refer to Japanese Patent No. 3093796).

Also known are: an organic EL element which has an organic light emitting layer containing 8-hydroxyquinoline aluminum complex as a host compound doped with a slight amount of a fluorescent compound (for example, refer to Japanese Patent Publication Open to Public Inspection (hereafter referred to as JP-A) No. 63-264692); and an organic EL element which has an organic light emitting layer containing 8-hydroxyquinoline aluminum complex as a host compound doped with a quinacridone type dye (for example, refer to JP-A No. 3-255190).

When light emitted through excited singlet state is used in the organic EL element as disclosed in the above Patent documents, the upper limit of the external quantum efficiency ($\eta$ext) is considered to be at most 5%, because the generation probability of excited species capable of emitting light is 25%, since the generation ratio of singlet excited species to triplet excited species is 1:3, and further, external light emission efficiency is 20%.

Since an organic EL element, employing phosphorescence through the excited triplet, has been reported by Prinston University (refer to M. A. Baldo et al., nature, 395, 151-154 (1998)), studies on materials emitting phosphorescence at room temperature have been actively carried out.

Examples are also reported in M. A. Baldo et al., Nature, 403(17), 750-753(2000) or in U.S. Pat. No. 6,097,147.

As the upper limit of the internal quantum efficiency of the excited triplet is 100%, the light emission efficiency of the exited triplet is theoretically four times higher than that of the excited singlet. Accordingly, light emission employing the excited triplet may enable almost the same performance as a cold cathode tube, and it is attracting attention to be applied as an illuminator.

For example, S. Lamansky et al., J. Am. Chem. Soc., 123, 4304 (2001) reports that many kinds of heavy metal complexes such as iridium complexes have been synthesized and studied.

In above mentioned M. A. Baldo et al., Nature, 403(17), 750-753 (2000), an example employing tris(2-phenylpyridine)iridium as a dopant has been studied.

As other examples, M. E. Tompson et al. have reported the application of $L_2Ir(acac)$ such as $(ppy)_2Ir(acac)$ as a dopant in the 10th International Workshop on Inorganic and Organic Electroluminescence (EL '00, Hamamatsu), and Moon-Jae Youn. 0 g, Tetsuo Tsutsui et al., have reported the application of tris(2-(p-tolyl)pyridine)iridium $(Ir(ptpy)_3)$, and tris(benzo[h]quinoline)iridium $(Ir(bzq)_3)$ as a dopant in the 10th International Workshop on Inorganic and Organic Electroluminescence (EL '00, Hamamatsu). These metal complexes are generally referred to as an ortho metalated iridium complex.

Also in aforementioned S. Lamansky et al., J. Am. Chem. Soc., 123, 4304 (2001), an application of various iridium complexes to an organic EL elements has been examined.

In order to obtain a higher emission efficiency, Ikai et al. have reported an application of a hole transport compound as a host material of a phosphorescent compound in the 10th International Workshop on Inorganic and Organic Electroluminescence (EL '00, Hamamatsu). Also, M. E. Tompson et al., have reported an application of various electron-transport compounds as a host material of a phosphorescent compound, which is further doped with a novel iridium complex.

An ortho metalated complex having platinum as a central metal instead of iridium is also attracting attention. Many examples of this type of complex having a characteristic ligand have been known (for example, refer to Patent Documents 1-5).

Since each of the above examples is related to phosphorescent emission, the luminance, and the emission efficiency are notably improved compared to the conventional organic EL elements, however, the emission life of each element have been shorter than those of the conventional organic EL elements. It has not been fully easy to overcome the problem of a high emission efficiency phosphorescent material that the emission wavelength tends to shift to a shorter wavelength range and that the emission life of the organic EL element is not fully long, and a fully satisfactory performance for the practical use has not been obtained.

As a material to improve the performance, known is an iridium complex or a platinum complex each having a phenyl imidazole derivative as a ligand (for example, refer to Patent Documents 6-8). However, the emission efficiencies exhibited by these complexes are not fully satisfactory, and a further improvement has been desired.

| | |
|---|---|
| Patent Document 1 | Japanese Patent Publication Open to Public Inspection (hereafter referred to as JP-A) No. 2002-332291 |
| Patent Document 2 | JP-A No. 2002-332292 |
| Patent Document 3 | JP-A No. 2002-338588 |

| | |
|---|---|
| Patent Document 4 | JP-A No. 2002-226495 |
| Patent Document 5 | JP-A No. 2002-234894 |
| Patent Document 6 | WO 02/15645 |
| Patent Document 7 | WO 05/7767 |
| Patent Document 8 | JP-A No. 2005-68110 |

SUMMARY OF THE INVENTION

An object of the present invention is to provide an organic EL element exhibiting a controlled emission wavelength, a high emission efficiency and a long life, and to provide an illuminator and a display using the organic EL element.

One of the aspects of the present invention is an organic electroluminescent element containing an anode, a cathode and having therebetween a light emitting layer, wherein the light emitting layer contains a guest compound having a substructure represented by Formula (AA): wherein A represents a group of atoms necessary to form an aromatic hydrocarbon ring or an aromatic heterocycle, B represents a group of atoms necessary to form a 5-membered aromatic heterocycle containing nitrogen or a 5-membered heterocycle containing nitrogen and M represents Ir or Pt, and a host compound represented by Formula (1): wherein $Ra_1$ represents an alkyl group, an alkenyl group, an alkynyl group, a cycloalkyl group, an aromatic hydrocarbon group, an aromatic heterocyclic group or a heterocyclic group, $R_1$, $R_2$ and $R_5$ each represent a hydrogen atom or a substituent, and n1, n2 and n5 each represent an integer of 0 to 4.

DESCRIPTION OF THE PREFERRED EMBODIMENTS

Figure 1:
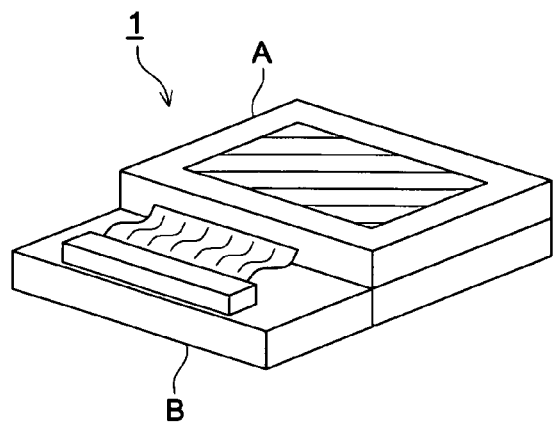
FIG. 1 is a view showing an example of a display having organic EL elements.

The above object of the present invention is achieved by the following structures.

(1) An organic electroluminescent element containing an anode and a cathode having therebetween a light emitting layer, wherein the light emitting layer contains a guest compound having a substructure represented by Formula (AA) and a host compound represented by Formula (1):

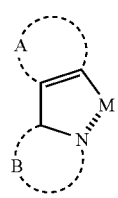

Formula (AA)

wherein A represents a group of atoms necessary to form an aromatic hydrocarbon ring or an aromatic heterocycle, B represents a group of atoms necessary to form a 5-membered aromatic heterocycle containing nitrogen or a 5-membered heterocycle containing nitrogen and M represents Ir or Pt,

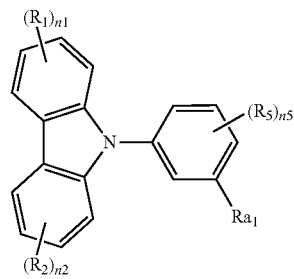

Formula (1)

wherein $Ra_1$ represents an alkyl group, an alkenyl group, an alkynyl group, a cycloalkyl group, an aromatic hydrocarbon group, an aromatic heterocyclic group or a heterocyclic group, $R_1$, $R_2$ and $R_5$ each represent a hydrogen atom or a substituent, and n1, n2 and n5 each represent an integer of 0 to 4.

(2) The organic electroluminescent element of Item (1), wherein the guest compound is represented by Formula (A):

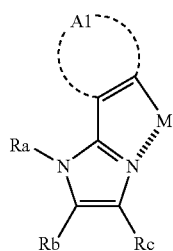

Formula (A)

wherein Ra represents a hydrogen atom, an alkyl group, an alkenyl group, an alkynyl group, a cycloalkyl group, an aromatic hydrocarbon group, an aromatic heterocyclic group or a heterocyclic group, Rb and Rc each represent a hydrogen atom or a substituent, A1 represents a group of atoms necessary to form an aromatic hydrocarbon ring or an aromatic heterocycle, M represents Ir or Pt.

(3) The organic electroluminescent element of Item (1), wherein the guest compound is represented by Formula (B):

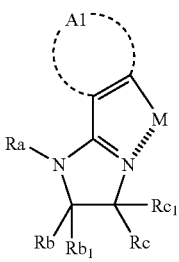

Formula (B)

wherein Ra represents a hydrogen atom, an alkyl group, an alkenyl group, an alkynyl group, a cycloalkyl group, an aromatic hydrocarbon group, an aromatic heterocyclic group or a hetertocyclic group, Rb, Rc, $Rb_1$ and $Rc_1$ each represent a hydrogen atom or a substituent, A1 represents a group of atoms necessary to form an aromatic hydrocarbon ring or an aromatic heterocycle, M represents Ir or Pt.

(4) The organic electroluminescent element of Item (1), wherein the guest compound is represented by Formula (C):

Formula (C)

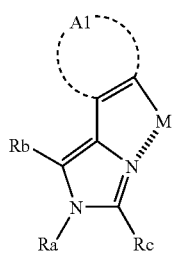

wherein, Ra represents a hydrogen atom, an alkyl group, an alkenyl group, an alkynyl group, a cycloalkyl group, an aromatic hydrocarbon group, an aromatic heterocyclic group or a heterocyclic group, Rb, and Rc each represent a hydrogen atom or a substituent, A1 represents a group of atoms necessary to form an aromatic hydrocarbon ring or an aromatic heterocycle, M represents Ir or Pt.

(5) The organic electroluminescent element of Item (1), wherein the host compound is represented by Formula (2):

Formula (2)

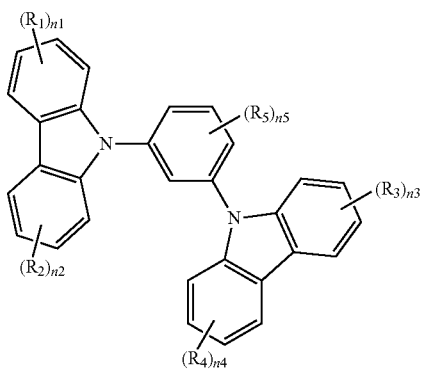

Formula (2)

wherein $R_1$ to $R_5$ each represent a substituent and n1 to n5 each represent an integer of 0 to 4.

(6) The organic electroluminescent element of Item (1), wherein the host compound is represented by Formula (3):

Formula (3)

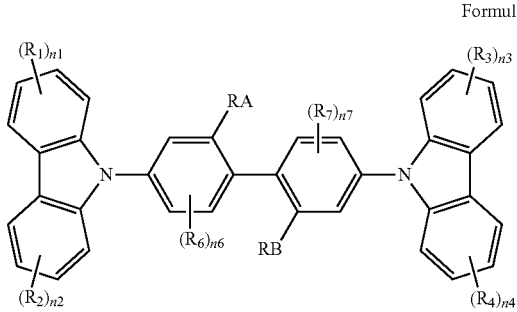

wherein $R_1$-$R_4$, $R_6$ and $R_7$ each represent a substituent; n1 to n4 each represent an integer of 0 to 4; n6 and n7 each represent an integer of 0 to 3; and RA and RB each represent a substituent.

(7) The organic electroluminescent element of any one of Items (2) to (4), wherein the aromatic hydrocarbon ring represented by A1 Formula (A) is a benzene ring.

(8) The organic electroluminescent element of any one of Items (2) to (4), wherein the guest compound represented by Formula (A) is a tris-form.

(9) The organic electroluminescent element of any one of Items (1) to (8) emitting blue light.

(10) The organic electroluminescent element of any one of Items (1) to (8) emitting white light.

(11) A display containing the organic electroluminescent element of any one of Items (1) to (10).

(12) An illuminator containing the organic electroluminescent element of any one of Items (1) to (10).

(13) A display containing the illuminator of Item (12) and a liquid crystal cell as a display means.

According to the present invention, obtained is an organic EL element exhibiting a controlled emission wavelength, a high emission efficiency and a long life, as well as an illuminator and a display using the organic EL element.

It was found in the present invention that, when a guest compound (also referred to as a emitting dopant) having a substructure represented by Formula (AA) is used in combination with a host compound represented by Formula (1), an excellent emission efficiency and long life of the organic EL element is attained.

Namely, it was found in the present invention that, when an organic EL element was designed so as to contain, in the emitting layer, a guest compound (also referred to as a emitting dopant) having a substructure represented by Formula (AA) together with a host compound represented by Formula (1), an excellent emission efficiency and long life of the organic EL element was attained. It was also found that a highly efficient display and an illuminator were obtained by using the organic EL element of the present invention.

The host compound represented by Formula (1) of the present invention will now be explained.

In the present invention, as a host compound, the compound represented by the above Formula (1) is preferable, and as a compound represented by Formula (1), the compound represented by the above Formula (2) or (3) is more preferable.

Examples of an alkyl group represented by $Ra_1$ in Formula (1) include: a methyl group, an ethyl group, a propyl group, a butyl group, a pentyl group, an isopentyl group, a 2-ethylhexyl group, an octyl group, an undecyl group, a dodecyl group and a tetradecyl group. These groups may further have a substituent represented by $R_1$, $R_2$, or $R_5$ in Formula (1), which will be explained later.

Examples of an alkenyl group represented by $Ra_1$ in Formula (1) include: a vinyl group, an allyl group, a 1-propenyl group, a 2-butenyl group, a 1,3-butadienyl group, a 2-pentenyl group and an isopropenyl group. These groups may further have a substituent represented by $R_1$, $R_2$, or $R_5$ in Formula (1), which will be explained later.

Examples of an alkynyl group represented by $Ra_1$ in Formula (1) include: an ethynyl group and a propargyl group. These groups may further have a substituent represented by $R_1$, $R_2$, or $R_5$ in Formula (1), which will be explained later.

Examples of a cycloalkyl group represented by $Ra_1$ in Formula (1) include: a cyclopentyl group and a cyclohexyl group. These groups may further have a substituent represented by $R_1$, $R_2$, or $R_5$ in Formula (1), which will be explained later.

Examples of an aromatic hydrocarbon group (also referred to as an aromatic ring group or an aryl group) represented by $Ra_1$ in Formula (1) include: a phenyl group, a tolyl group, an azulenyl group, an anthranyl group, a phenanthryl group, a pyrenyl group, a chrysenyl group, a naphthacenyl group, an o-terphenyl group, a m-terphenyl group, a para-terphenyl group, an acenaphthenyl, a coronenyl group, a fluorenyl group and a pertlenyl group. These groups may further have a substituent represented by $R_1$, $R_2$, or R5 in Formula (1), which will be explained later.

Examples of an aromatic heterocycle group represented by $Ra_1$ in Formula (1) include: a pyrrolyl group, a furyl group, a thienyl group, a pyridyl group, a pyridazinyl group, a pyrimidinyl group, a pyrazinyl group, a triazinyl group, an indolyl group, an indolizinyl group, an imidazolyl group, a pyrazolyl group, a thiazolyl group, a thiadiazinyl group, an oxadiazorinyl group, a benzoquinolinyl group, a thiadiazolyl group, a quinolinyl group, a quinazolinyl group, an oxadiazolyl group, a benzoquinolinyl group, a thiadiazolyl group, a pyrrolothiazolyl group, a pyrrolopyridazinyl group, a tetrazolyl group, an oxazolyl group, a carbazolyl group, a carbolinyl group, a diazacarbazolyl group (in which one of the carbon atoms which constitute the carboline ring of the above carbolinyl group is replaced with a nitrogen atom) and a phthalazinyl group. These groups may further have a substituent represented by $R_1$, $R_2$, or $R_5$ in Formula (1), which will be explained later.

Examples of a heterocycle group represented by $Ra_1$ in Formula (1) include: a pyrrolidyl group, an imidazolysyl group, an morpholyl group and an oxazolisyl group. These groups may further have a substituent represented by $R_1$, $R_2$, or $R_5$ in Formula (1), which will be explained later.

Examples of substituents represented $R_1$, $R_2$ and $R_5$ in Formula (1) include: an alkyl group (for example, a methyl group, an ethyl group, a propyl group, an isopropyl group, a tert-butyl, a pentyl group, a hexyl group, an octyl group, a dodecyl group, a tridecyl group, a tetradecyl group and a pentadecyl group); cycloalkyl groups (for example, a cyclopentyl group and a cyclohexyl group); alkenyl groups (for example, a vinyl group and an allyl group); alkynyl groups (for example, an ethynyl group and a propargyl group); aromatic hydrocarbon groups (also referred to as an aromatic ring group or an aryl group, for example, a phenyl group and a naphthyl group); aromatic heterocycle groups (for example, a furyl group, a thienyl group, a pyridyl group, a pyridazinyl group, pyrimidinyl group, a pyrazinyl group, a triazinyl group, an imidazolyl group, a pyrazolyl group, a thiazolyl group, a quinazolinyl group and a phthalazinyl group); heterocycle groups (for example, a pyrrolidyl group, an imidazolysyl group, a morpholyl group and an oxazolisyl group); alkoxy groups (for example, a methoxy group, an ethoxy group, a propyloxy group, a pentyloxy group, a hexyloxy group, an octyloxy group and a dodecyl oxygroup); cycloalkoxyl groups (for example, a cyclopentyloxy group and a cyclohexyloxy group); aryloxy groups (for example, a phenoxy group and a naphthyloxy group); alkylthio groups (for example, a methylthio group, an ethylthio group, a propylthio group, a pentylthio group, a hexylthio group, an octylthio group and a dodecylthio group); cycloalkylthio groups (for example, a cyclopentylthio group and a cyclohexylthio group); arylthio groups (for example, a phenylthio group and a naphthylthio group); alkoxycarbonyl groups (for example, a methyloxycarbonyl group, an ethyloxycarbonyl group, a butyloxycarbonyl group, an octyloxycarbonyl group and a dodecyloxycarbonyl group); aryloxycarbonyl groups (for example, a phenyloxycarbonyl group and a naphthyloxycarbonyl group); sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodedylaminosulfonyl group, a phenylaminosulfonyl group, a naphthylaminosulfonyl group and a 2-pyridylaminosulfonyl group); acyl groups (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group and a pyridylcarbonyl group); acyloxy groups (for example, an acetyloxy group, an ethylcarbonyloxy group, a butylcarbonyloxy group, an octylcarbonyloxy group, a dodecylcarbonyloxy group and a phenylcarbonyloxy group); amide groups (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group and a naphthylcarbonylamino group); carbamoyl groups (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridyaminocarbonyl group); ureido groups (for example, a methylureido group, an ethylureido group, a pentylureido group, a cyclohexylureido group, an octylureido group, a dodecylureido group, a phenylureido group, a naphthylureido group and a 2-pyridyl amino ureido group); sulfinyl groups (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group); alkylsulfonyl groups (for example, a methylsulfonyl group, an ethylsulfonyl group, a butylsulfonyl group, a cyclohexylsulfonyl group, a 2-ethylhexylsulfonyl group and a dodecylsulfonyl group); arylsulfonyl groups (for example, a phenylsulfonyl group, a naphthylsulfonyl group and a 2-pyridylsulfonyl group); amino groups (for example, an amino group, an ethylamino group, a dimethylamino group, a butylamino group, a cyclopentylamino group, a 2-ethylhexylamino group, a dodecylamino group, an anilino group, a naphthylamino group and a 2-pyridylamino group); halogen atoms (for example, a fluorine atom, a chlorine atom and a bromine atom); hydrofluorocarbon groups (for example, a fluoromethyl group, a trifluoromethyl group, a pentafluoroethyl group and a pentafluorophenyl group); a cyano group; a nitro group; a hydroxyl group; a mercapto group; and silyl groups (for example, a trimethylsilyl group, a triisopropylsilyl group, a triphenylsilyl group and a phenyldiethylsilyl group). These groups may further be replaced with the above-mentioned substituent.

The substituents represented by $R_1$-$R_7$, RA and RB in Formulas (2) and (3) are common to those represented by $R_1$, $R_2$ and $R_5$ in Formula (1).

Specific examples of a host compound represented by Formula (1), (2) or (3) are shown below, however, the present invention is not limited thereto.

H-1
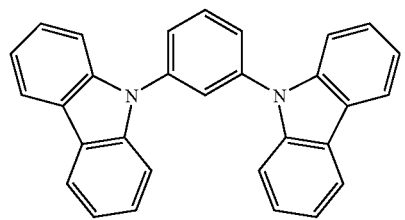
H-2
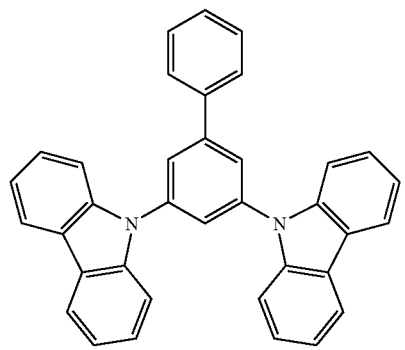
H-3
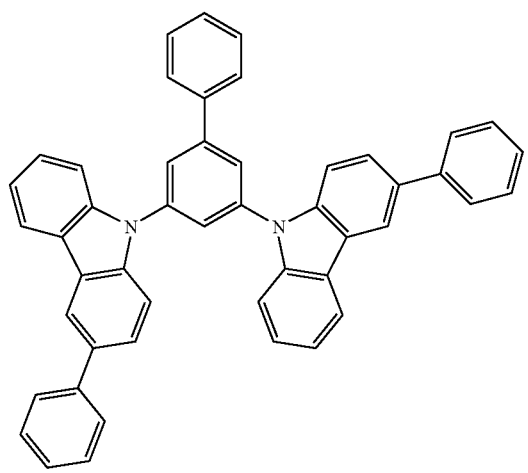
H-4
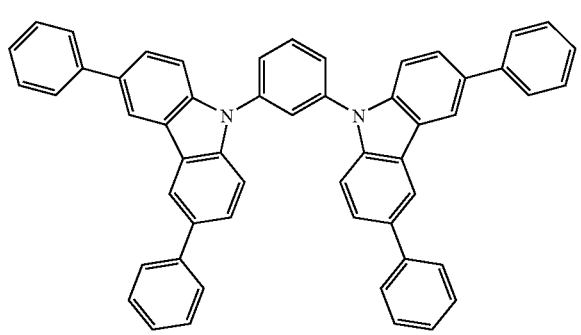
-continued
H-5
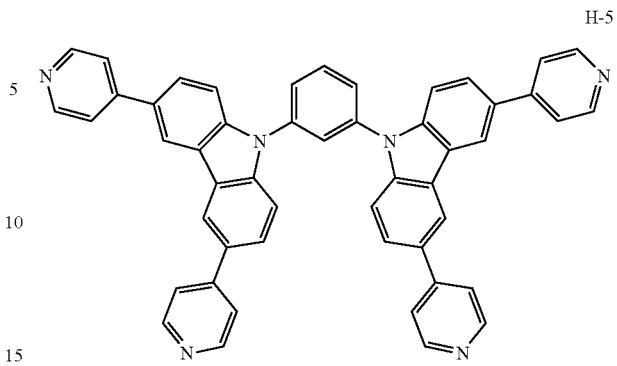
H-6
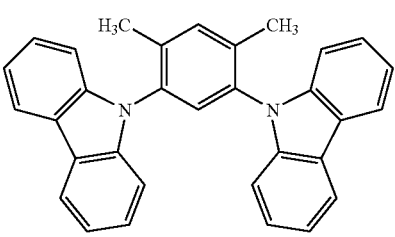
H-7
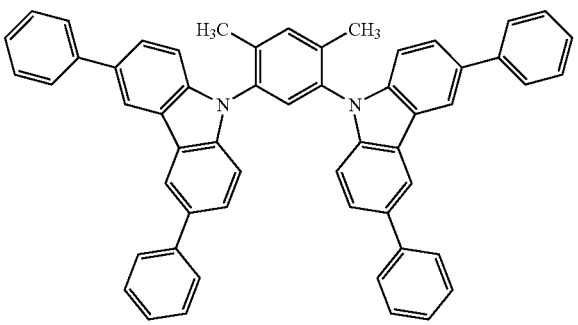
H-8
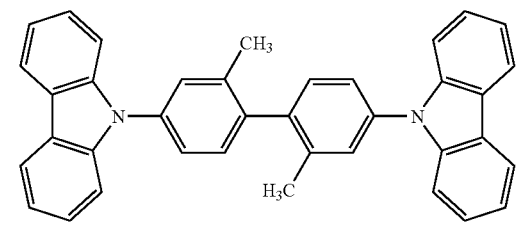
H-9
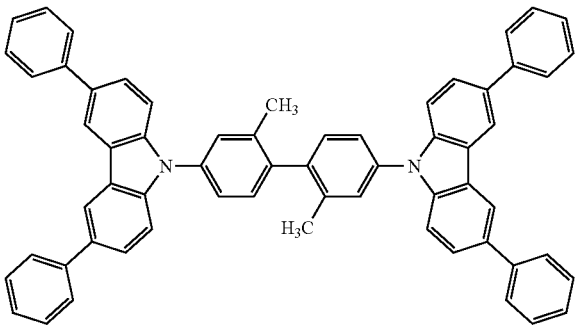

H-10
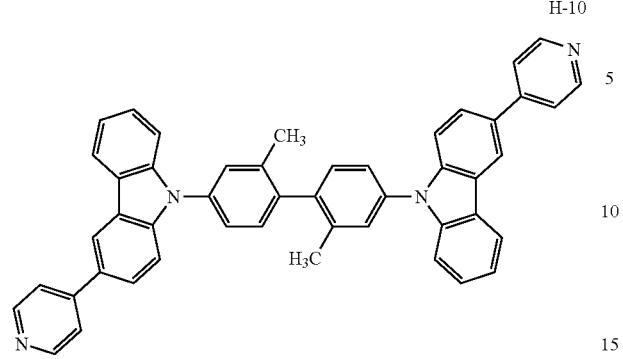
H-11
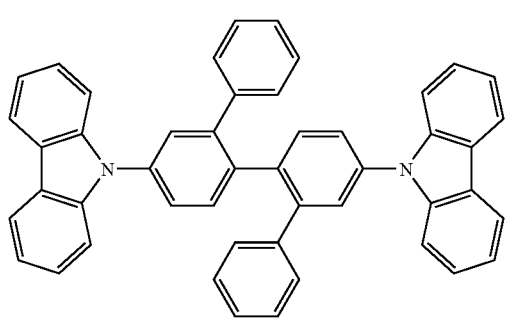
H-12
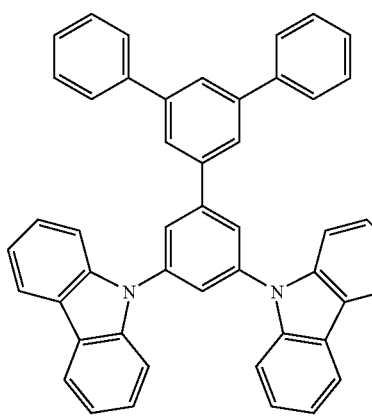
H-13
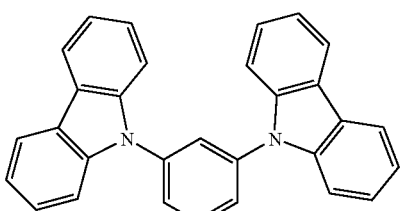
H-14
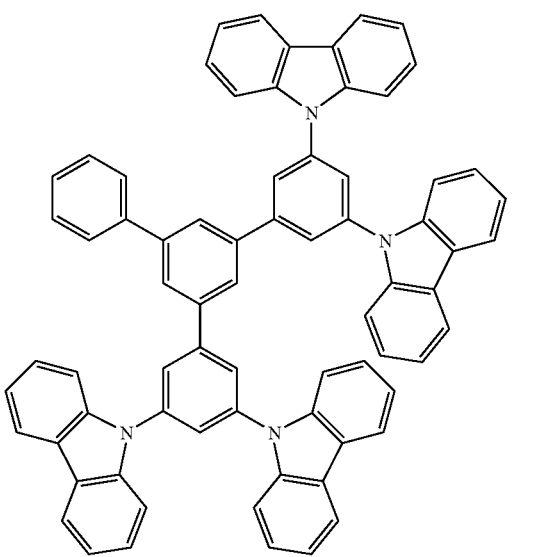
H-15
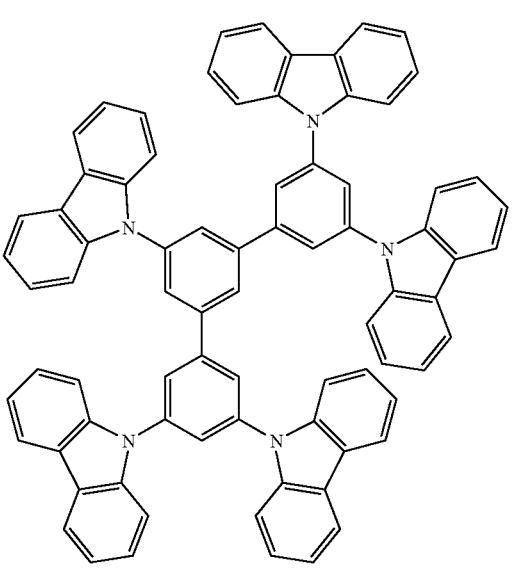
H-16
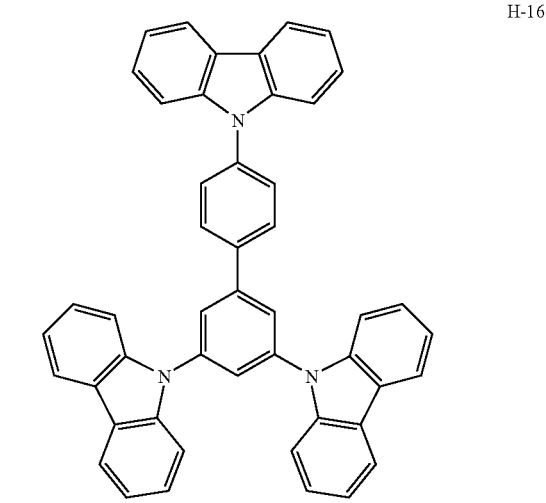

-continued

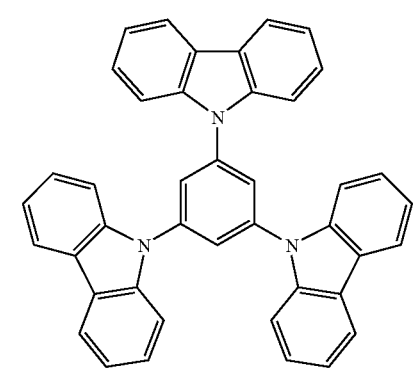
H-17

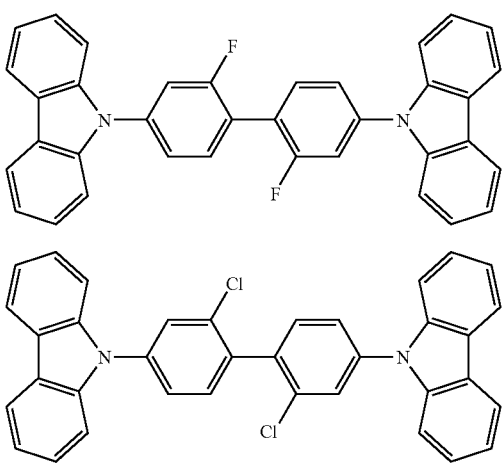
H-18

H-19

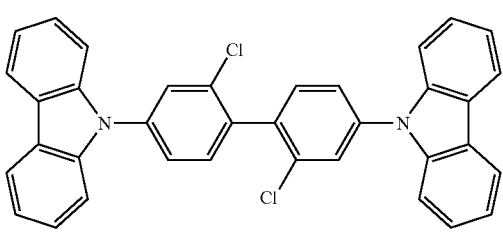

H-20

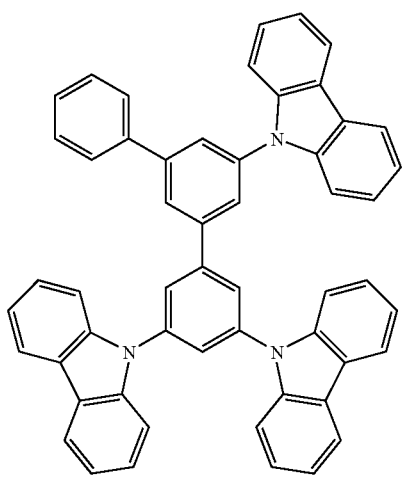

Guest compounds (also referred to as emission dopants) of the present invention having substructures represented by Formula (AA), (A), (B), or (C) will now be explained.

In Formulas (AA), (A), (B) and (C), A and A1 each represent an atomic group forming an aromatic hydrocarbon ring or an aromatic heterocycle. Examples of the aromatic hydrocarbon ring include: a benzene ring, a biphenyl ring, a naphthalene ring, an azulene ring, an anthracene ring, A phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoroanthrene ring, a naphthacene ring, a pentacene ring, a perylene ring, a pentaphene ring, a picene ring, a pyrene ring, the Pyranthrene ring and an anthranthrene ring. Examples of the aromatic heterocycle include: a furan ring, a thiophene ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, a benzimidazole ring, a benzothiazole ring, a benzoxazole ring, a quinoxaline ring, a quinazoline ring, a phthalazine ring, a carbazole ring, a carboline ring and a diazacarbazole ring (in which one of the carbon atoms of the hydrocarbon ring which constitutes a carboline ring is further replaced by a nitrogen atom).

In Formulas (A), (B) and (C), Ra represent a hydrogen atom, an alkyl group, an alkenyl group, an alkynyl group, a cycloalkyl group, an aromatic hydrocarbon group, an aromatic heterocycle group, or a heterocycle group, and Rb, Rc, $Rb_1$, and $Rc_1$, each represent a hydrogen atom or a substituent, wherein Ra is common to $Ra_1$ in Formula (1). The substituents represented by Rb, Rc, $Rb_1$, or $Rc_1$, are common to the substituents represented by $R_1$, $R_2$ or $R_5$ in Formula (1).

The structure represented by each of Formula (AA), (A), (B) and (C) is a substructure and needs one or more ligand according to the valence of the central metal to complete the structure as an emission dopant. Examples of the ligand include: a halogen atom (for example, a fluorine atom, a chlorine atom, a bromine atom, or an iodine atom), an aromatic hydrocarbon group (also referred to as an aromatic hydrocarbon ring group or an aryl group, for example, a phenyl group, a p-chlorophenyl group, a mesityl group, a tolyl group, a xylyl group, a biphenyl group, a naphthyl group, an anthryl group and a phenanthryl group), an alkyl group (for example, a methyl group, an ethyl group, an isopropyl group, and a hydroxyethyl group, a methoxymethyl group, a trifluoromethyl group and t-butyl group), an alkyloxy group, an aryloxy group, an alkylthio group, an arylthio group, an aromatic heterocycle group (for example, a furyl group, a thienyl group, a pyridyl group, a pyridazinyl group, and a pyrimidinyl group, a pyrazinyl group, a triazinyl group, an imidazolyl group, a pyrazolyl group, a thiazolyl group, a quinazolinyl group, a carbazolyl group, a carbolinyl group and a phthalazinyl group) and a substructure represented by Formula (AA), (A), (B), or (C), from which central metal M is removed.

In Formulas (A)-(C), M represents Ir or Pt, and specifically, Ir is preferable. Moreover, preferable is a tris-form including the substructures represented by Formula (A), (B) or (C).

Examples of the guest compounds (also referred to as emission dopants) of the present invention having a substructure represented by above Formula (AA), (A), (B) or (C) are shown below, however, the present invention is not limited thereto.

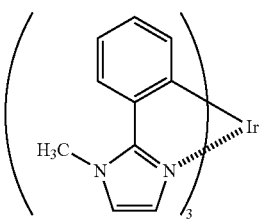
D-1

D-2 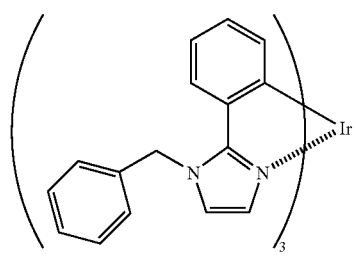
D-3 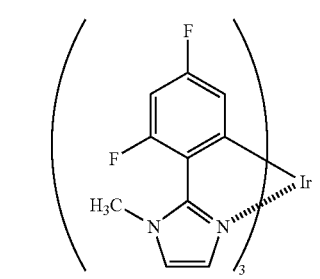
D-4 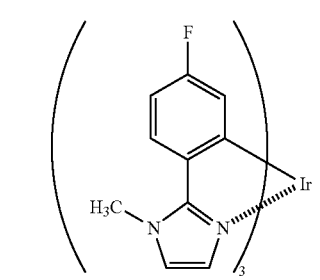
D-5 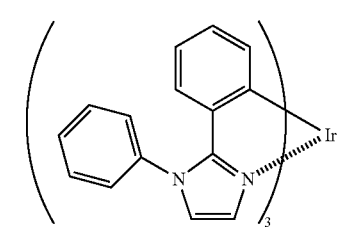
D-6 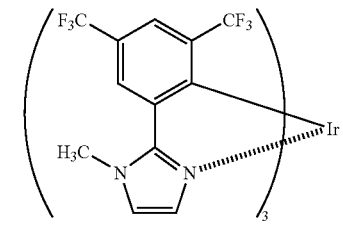
D-7 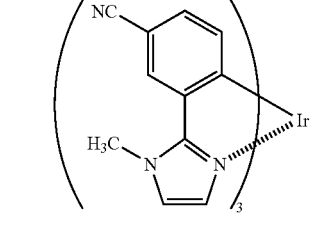
D-8 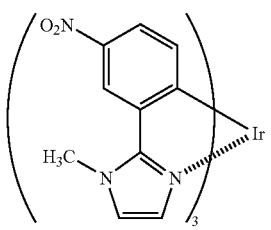
D-9 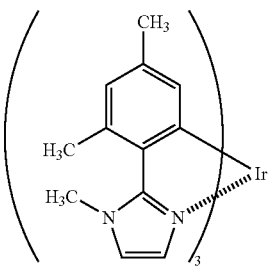
D-10 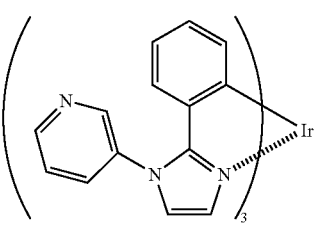
D-11 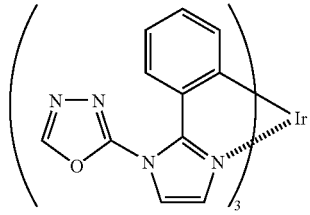
D-12 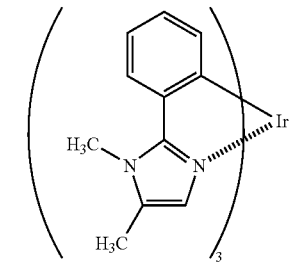
D-13 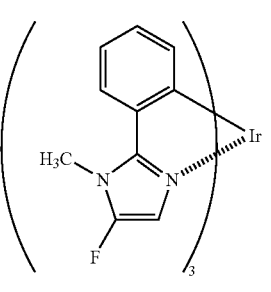

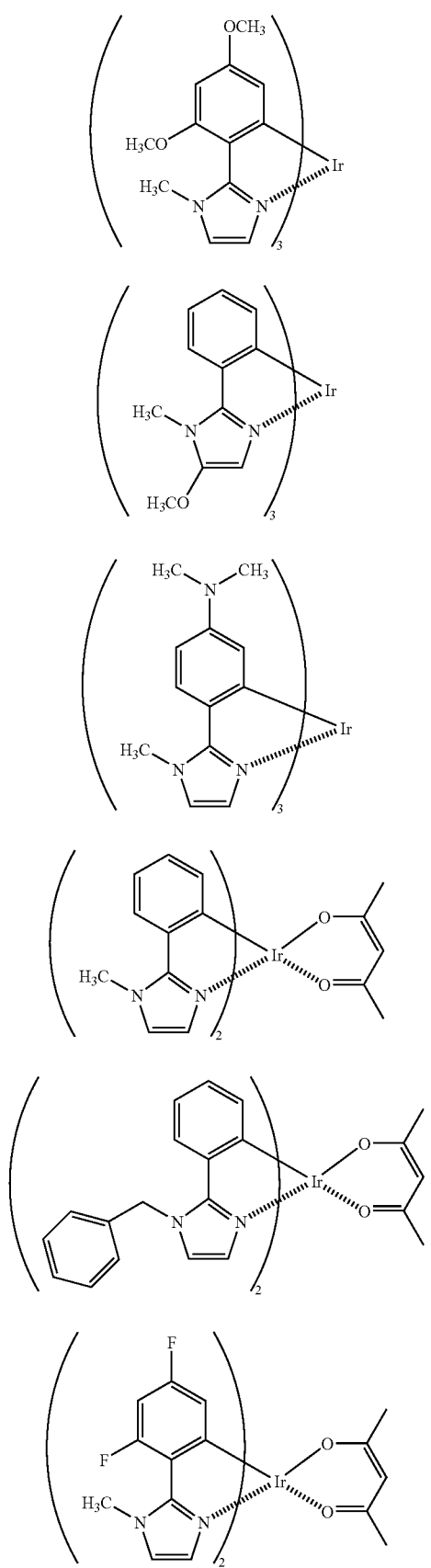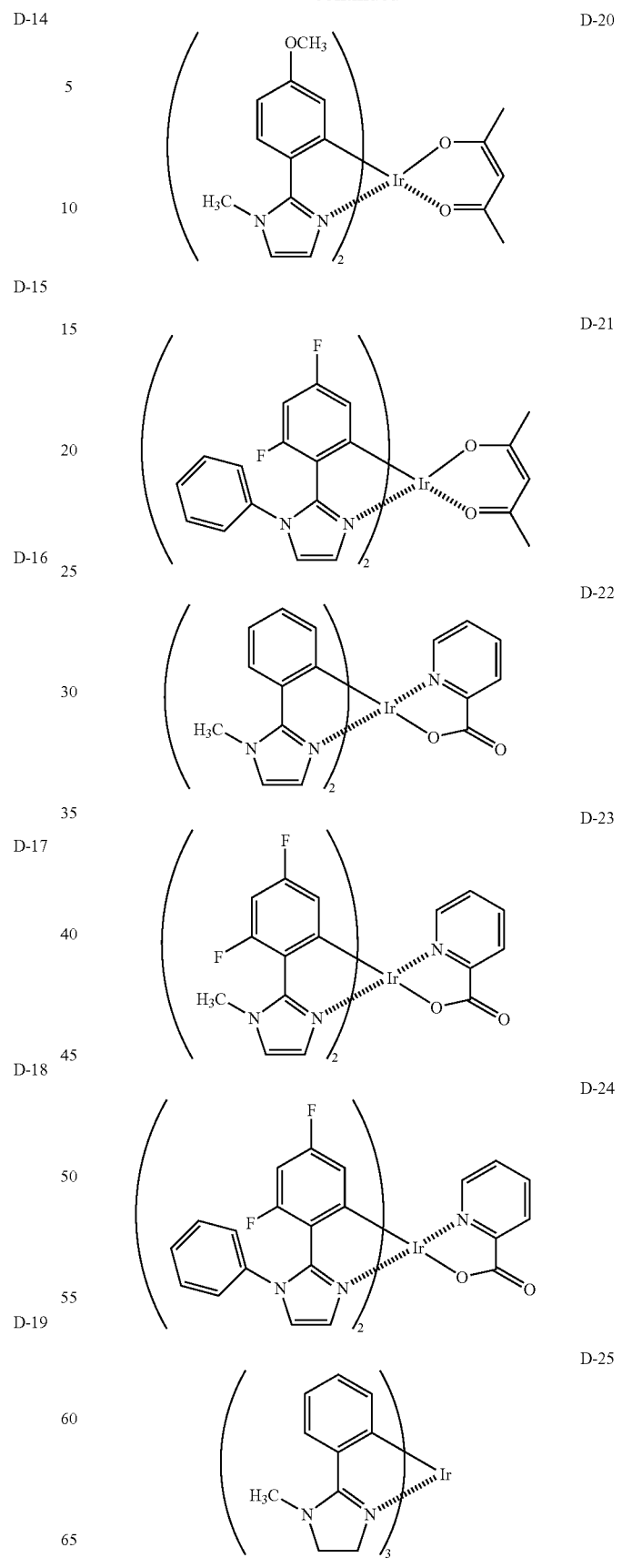

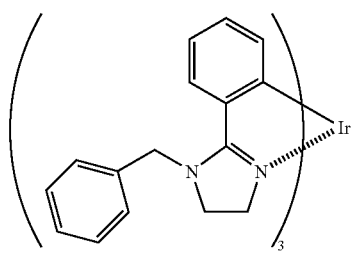
D-26
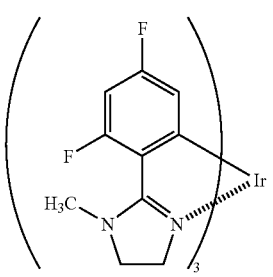
D-27
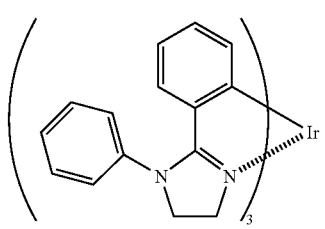
D-28
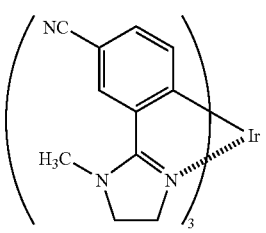
D-29
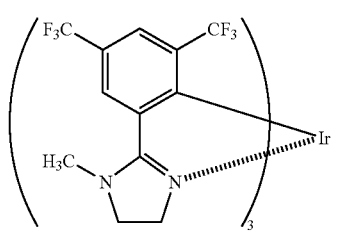
D-30
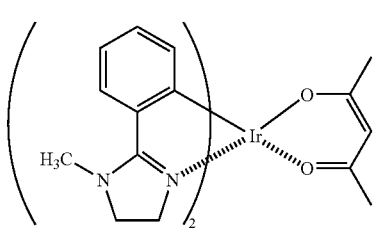
D-31
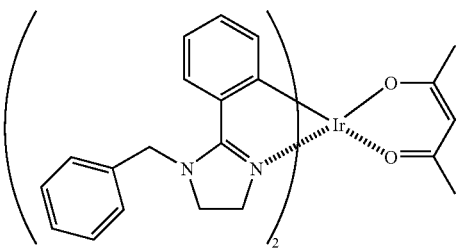
D-32
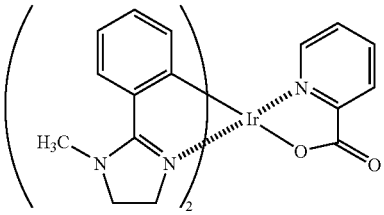
D-33
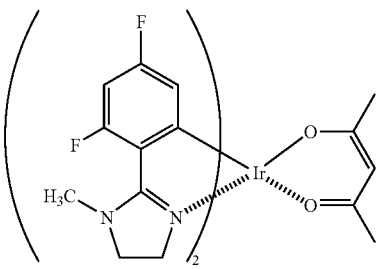
D-34
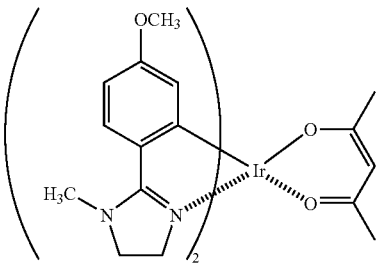
D-35
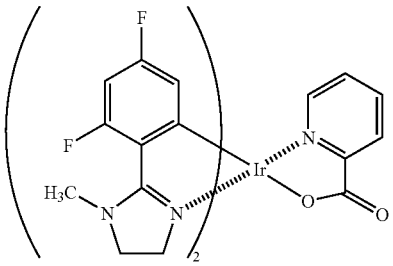
D-36
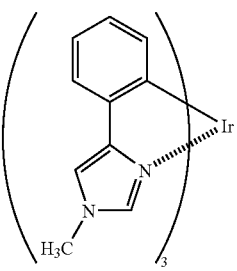
D-37

D-38 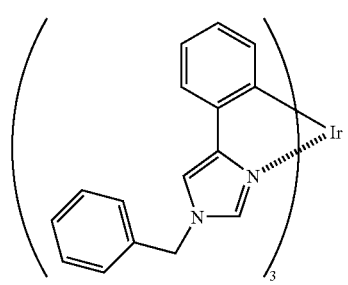
D-39 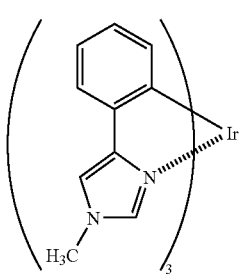
D-40 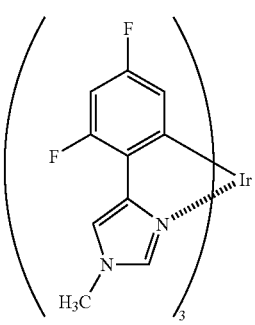
D-41 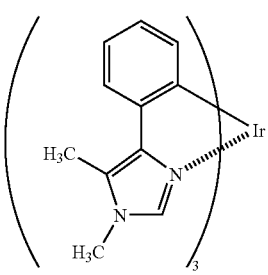
D-42 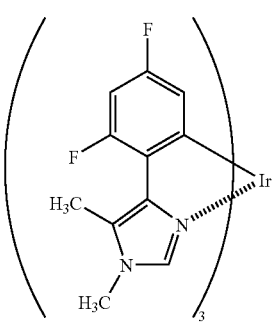
D-43 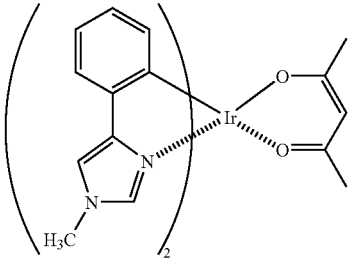
D-44 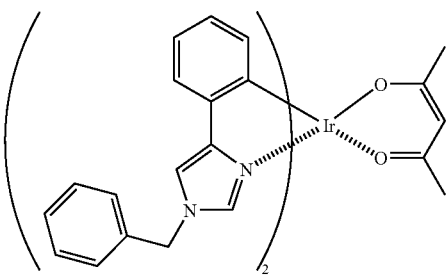
D-45 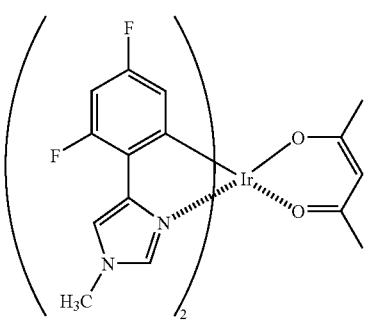
D-46 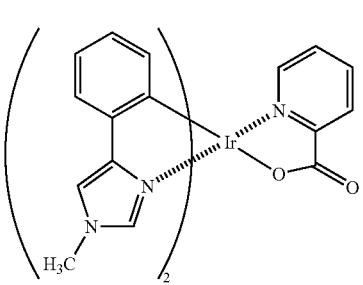
D-47 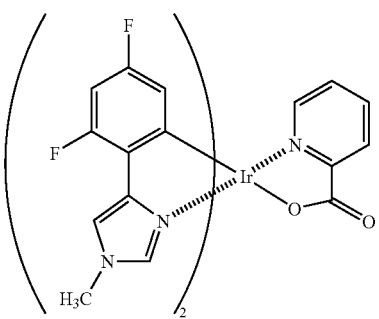

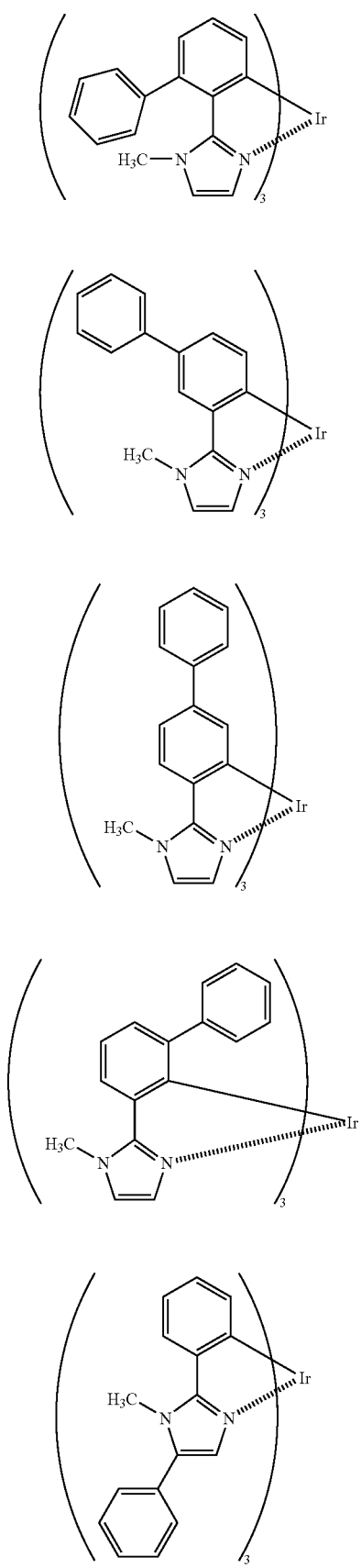
D-48
D-49
D-50
D-51
D-52
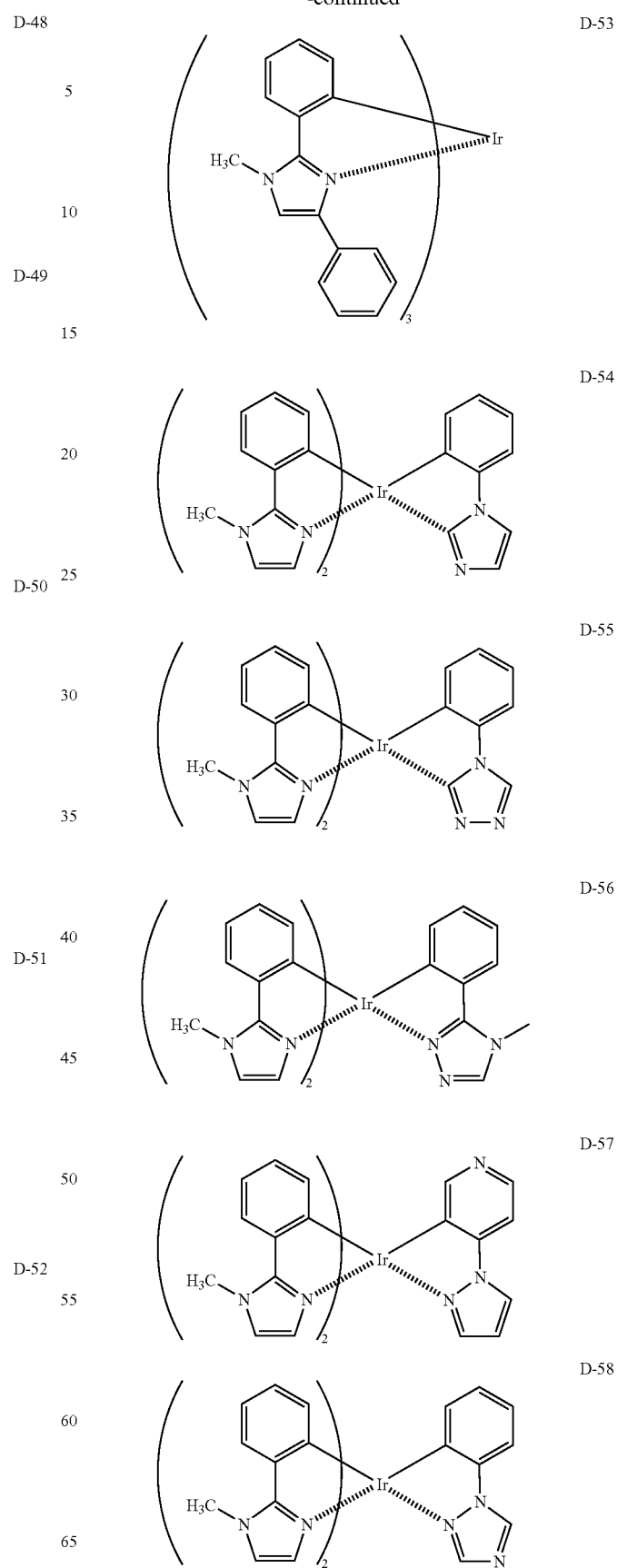
D-53
D-54
D-55
D-56
D-57
D-58

-continued

D-59
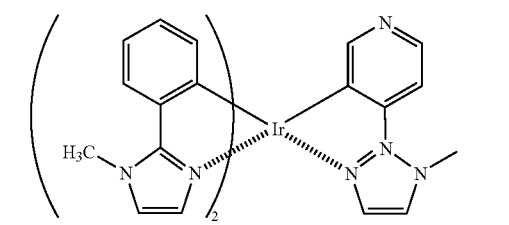

D-60
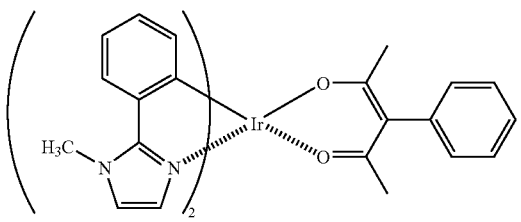

D-61
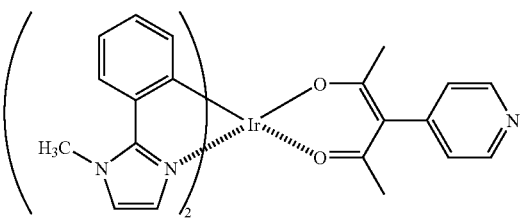

D-62
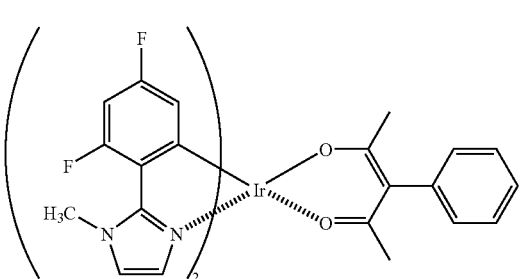

D-63
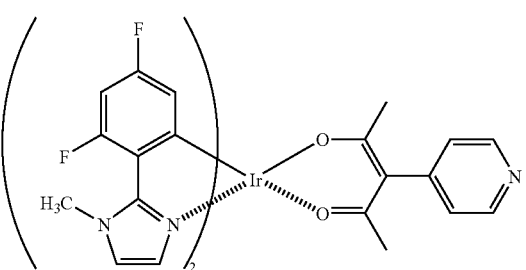

D-64
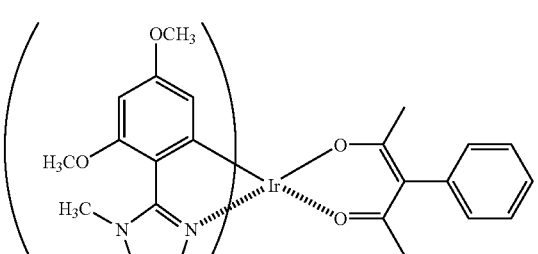

-continued

D-65
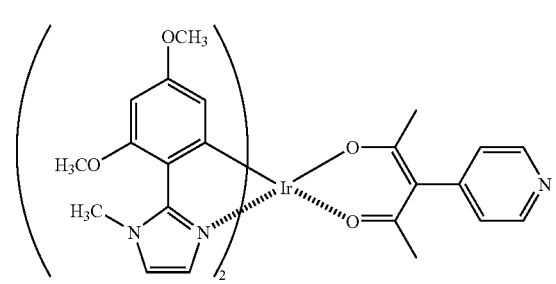

A synthetic example of a compound having the substructure represented by Formula (AA), (A), (B), or (C) of the present invention will be shown.
Example of Synthesis of D-1:
Example of Synthesis

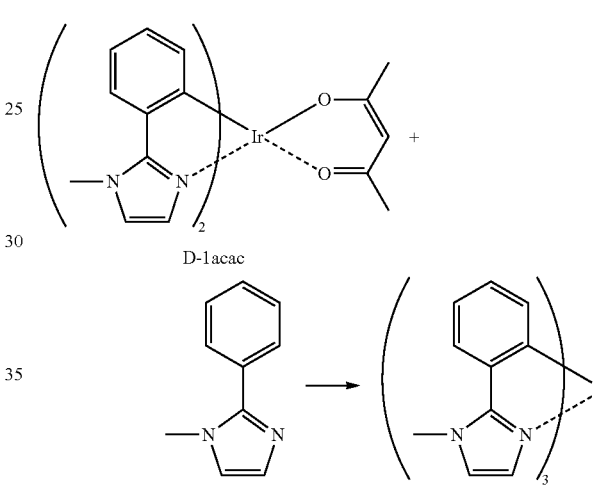

In a three necked 500 ml flask, (i) 4.0 g of D-1acac, 2.6 g of phenylimidazole and 300 ml of glycerin were charged, (ii) a thermometer and the a condenser tube were attached, (iii) the flask was set on the oil bath equipped with a stirrer, (iv) bath temperature was gradually increased and then adjusted so that the inside temperature was kept at 150° C., (v) the content was kept agitating for 5 hours to complete the reaction, (vi) deposition of crystals were observed when the product was cooled to room temperature, (vii) the product was diluted with 200 ml of methanol, (viii) the crystals were separated by filtering, washed with methanol, and dried to obtain 1.6 g (36.5%) of the product. The crystal was identified to be D-1 by using $^1$H-NMR (nuclear magnetic resonance spectral method) and MS (mass spectrometry).

Details of the constituting layers of an organic EL element of the present invention will now be explained. Examples of preferable constituting layer of the organic EL element are shown below, however, the present invention is not limited thereto.
(i): Anode/Light emitting layer/Electron transporting layer/Cathode
(ii): Anode/Hole transporting layer/Light emitting layer/Electron transporting layer/Cathode
(iii): Anode/Hole transporting layer/Light emitting layer/Hole blocking layer/Electron transporting layer/Cathode (iv): Anode/Hole transporting layer/Light emitting layer/Hole blocking layer/Electron transporting layer/Cathode buffer layer/Cathode (v): Anode/Anode buffer layer/Hole transporting layer/Light emitting layer/Hole blocking layer/Electron transporting layer/Cathode buffer layer/Cathode <<Anode>>

For the anode of the organic EL element, a metal, an alloy, or an electroconductive compound each having a high working function (not less than 4 eV), and mixture thereof are preferably used as the electrode material. Specific examples of such an electrode material include a metal such as Au, CuI and a transparent electroconductive material such as indium tin oxide (ITO), $SnO_2$, or ZnO. A material capable of forming an amorphous and transparent conductive layer such as IDIXO ($In_2O_3$—ZnO) may also be used. The anode may be prepared by forming a thin layer of the electrode material according to a depositing or spattering method, and by forming the layer into a desired pattern according to a photolithographic method. When required precision of the pattern is not so high (not less than 100 µm), the pattern may be formed by depositing or spattering of the electrode material through a mask having a desired form. When light is emitted through the anode, the transmittance of the anode is preferably 10% or more, and the sheet resistance of the anode is preferably not more than several hundred $\Omega/\square$. The thickness of the layer is ordinarily within the range of from 10 to 1000 nm, and preferably from 10 to 200 nm, although it may vary due to kinds of materials used.

<<Cathode>>

On the other hand, for the cathode, a metal (also referred to as an electron injecting metal), an alloy, and an electroconductive compound each having a low working function (not more than 4 eV), and a mixture thereof are used as the electrode material. Specific examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or spattering method. The sheet resistance as the cathode is preferably not more than several hundred $\Omega/\square$, and the thickness of the layer is ordinarily from 10 nm to 5 µm, and preferably from 50 to 200 nm. It is preferable in increasing the light emission efficiency that either the anode or the cathode of the organic EL element is transparent or semi-transparent.

After a layer of the metal described above as a cathode is formed to give a thickness of from 1 to 20 nm, a layer of the transparent electroconductive material as described in the anode may be formed on the resulting metal layer, whereby a transparent or semi-transparent cathode can be prepared. Employing the cathode, an organic EL element can be manufactured in which both anode and cathode are transparent.

Injecting layer, blocking layer, electron transporting layer will now be explained.

<<Injecting Layer: Electron Injecting Layer, Hole Injecting Layer>>

The injecting layer is optionally provided, for example, an electron injecting layer or a hole injecting layer, and may be provided between the anode and the light emitting layer or hole transporting layer, and between the cathode and the light emitting layer or electron transporting layer as described above.

The injecting layer herein referred to is a layer provided between the electrode and the organic layer in order to reduce the driving voltage or to improve of light emission efficiency. As the injecting layer there are a hole injecting layer (an anode buffer layer) and an electron injecting layer (a cathode buffer layer), which are described in "Electrode Material" pages 123-166, Div. 2 Chapter 2 of "Organic EL element and its frontier of industrialization" (published by NTS Corporation, Nov. 30, 1998) in detail.

The anode buffer layer (hole injecting layer) is described in, for example, JP-A Nos. 9-45479, 9-260062, and 8-288069, and its examples include a phthalocyanine buffer layer represented by a copper phthalocyanine layer, an oxide buffer layer represented by a vanadium oxide layer, an amorphous carbon buffer layer, a polymer buffer layer employing and an electroconductive polymer such as polyaniline (emeraldine) and polythiophene.

The cathode buffer layer (electron injecting layer) is described in, for example, JP-A Nos. 6-325871, 9-17574, and 10-74586, in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide. The buffer layer (injecting layer) is preferably very thin and has a thickness of preferably from 0.1 to 5 µm depending on kinds of the material used.

<<Blocking Layer: Hole Blocking Layer, Electron Blocking Layer>>

The blocking layer is a layer provided if necessary in addition to the fundamental component layers as described above, and is for example a hole blocking layer as described in JP-A Nos. 11-204258, and 11-204359, and on page 237 of "Organic EL element and its frontier of industrialization" (published by NTS Corporation, Nov. 30, 1998).

The hole blocking layer is an electron transporting layer in a broad sense, and is a material having an ability of transporting electrons, however, an extremely poor ability of transporting holes, which can increase a recombination probability of electrons and holes by transporting electrons while blocking holes.

The hole blocking layer of the organic EL element of the present invention is provided adjacent to the light emitting layer.

In the present invention, the hole blocking layer preferably contains the above mentioned compounds relating the present invention as a hole blocking material, whereby an organic EL element exhibiting a higher emission efficiency is obtained, further an organic EL element exhibiting a longer life is obtained.

On the other hand, the electron blocking layer is an hole transporting layer in a broad sense, and is a material having an ability of transporting holes, however, an extremely poor ability of transporting electrons, which can increase a recombination probability of electrons and holes by transporting holes while blocking electrons.

<<Light Emitting Layer>>

The light emitting layer of the present invention is a layer where electrons and holes, injected from electrodes, an electron transporting layer or a hole transporting layer, are recombined to emit light. The portions where light is emitted may be in the light emitting layer or at the interface between the light emitting layer and the layer adjacent thereto.

(Host Compounds)

The light emitting layer of the present invention preferably contains a host compound and an emitting dopant (also referred to as a phosphorescent light emitting compound) described above. In the present invention, the above described compounds relating to the present invention are preferably used as a host compound, whereby an organic EL element exhibiting higher emission efficiency is obtained. Further, other compounds besides the relating compounds to the present invention may also be used as a host compound.

In the present invention, a host compound is defined as a compound of which the quantum yield of phosphorescent light emission is less than 0.01 at 25° C.

A plurality of known host compounds may also be used in combination. Use of a plurality of host compounds makes the control of the transfer of electrons possible, and an organic EL element exhibiting higher light emission efficiency is obtained. Also, use of a plurality of phosphorescent compounds makes it possible to mix different colors of emitted light, and an arbitrary color of emitted light is obtained. Emission of white light is possible by adjusting the types and amounts of doping of mixed phosphorescent compounds, whereby application of the organic EL element to an illuminator or a backlight is possible.

Among the known host compounds, preferable are the compounds having hole transporting ability, electron transporting ability, effect to prevent a shift of light emission to a longer wavelength side and a high Tg (a glass transition temperature).

Examples of the known host compounds include the compounds disclosed in the following documents:

JP-A No. 2001-257076, No. 2002-308855, No. 2001-313179, No. 2002-319491, No. 2001-357977, No. 2002-334786, No. 2002-8860, No. 2002-334787, No. 2002-15871, No. 2002-334788, No. 2002-43056, No. 2002-334789, No. 2002-75645, No. 2002-338579, No. 2002-105445, No. 2002-343568, No. 2002-141173, No. 2002-352957, No. 2002-203683, No. 2002-363227, No. 2002-231453, No. 2003-3165, No. 2002-234888, No. 2003-27048, No. 2002-255934, No. 2002-260861, No. 2002-280183, No. 2002-299060, No. 2002-302516, No. 2002-305083, No. 2002-305084, No. 2002-308837.

The light emitting layer may contain a host compound having a fluorescence maximum wavelength as a host compound. In this case, by a energy transfer from other host compound or a phosphorescent compound to a fluorescent compound, light emission from a host compound having a fluorescence maximum wavelength is obtained as the result of electroluminescence of an organic EL element. The host compound having a fluorescence maximum wavelength preferably has a high fluorescence quantum yield in the form of solution. Herein, the fluorescence quantum yield is preferably not less than 10%, and more preferably not less than 30%. Examples of the a host compound having a wavelength providing a fluorescence maximum wavelength include a coumarin dye, a cyanine dye, a chloconium dye, a squalenium dye, an oxobenzanthracene dye, a fluorescene dye, a rhodamine dye, a pyrylium dye, a perylene dye, a stilbene dye, and a polythiophene dye. The fluorescence quantum yield can be measured according to a method described in the fourth edition, Jikken Kagaku Koza 7, Bunko II, p. 362 (1992) published by Maruzen. (Guest Compounds (also referred to as Emitting Dopant))

The guest compound (also referred to as Emitting Dopant) of the present invention is a compound which emits light from the excited triplet, which can emit phosphorescence at room temperature (25° C.), and exhibits a phosphorescent quantum yield at 25° C. of not less than 0.01. The phosphorescent quantum yield at 25° C. is preferably not less than 0.1. The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The guest compound used of the present invention is a compound, in which the phosphorescent quantum yield measured employing any one of the solvents falls within the above-described range.

The light emission of the guest compound is divided in two types in principle, one is an energy transfer type in which recombination of a carrier occurs on the host to which the carrier is transported to excite the host, the resulting energy is transferred to the phosphorescent compound, and light is emitted from the phosphorescent compound, and the other is a carrier trap type in which recombination of a carrier occurs on the phosphorescent compound which is a carrier trap material, and light is emitted from the phosphorescent compound. However, in each type, energy level of the phosphorescent compound in excited state is lower than that of the host in excited state.

In addition to the guest compounds of the present invention having a substructure represented by Formula (AA), (A), (B) (C), a known guest compound, for example, listed below may be used in combination.

These compounds can be synthesized according to a method described in Inorg. Chem., 40, 1704-1711.

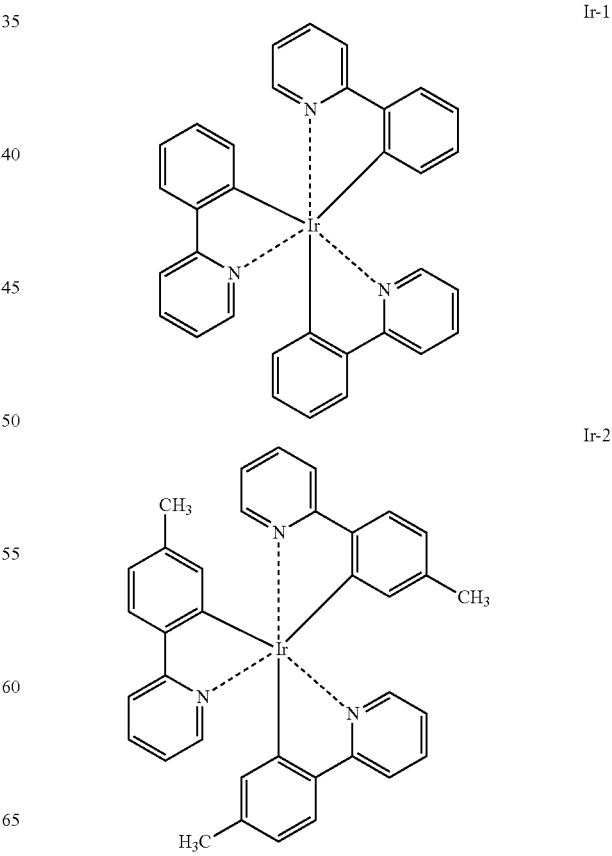

Ir-3
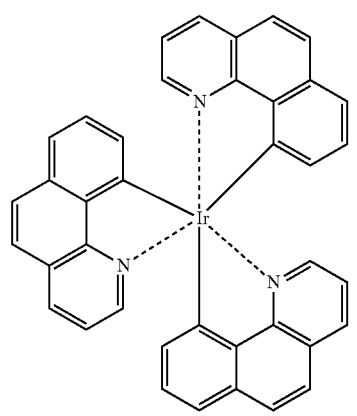
Ir-4
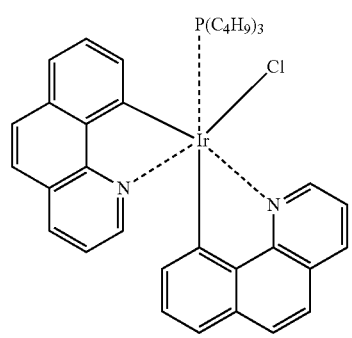
Ir-5
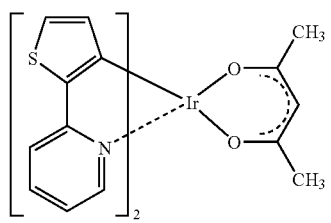
Ir-6
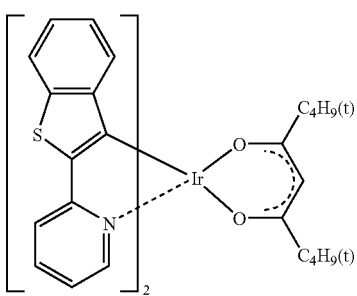
Ir-7
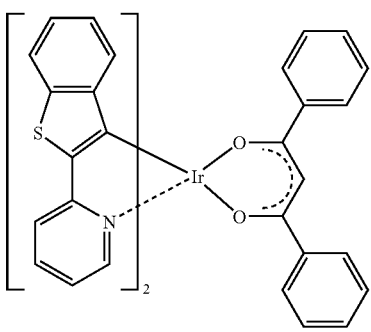
Ir-8
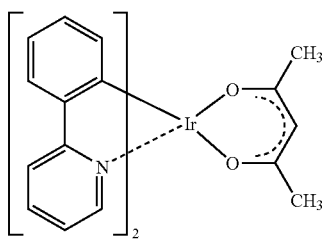
Ir-9
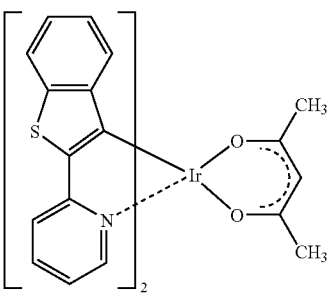
Ir-10
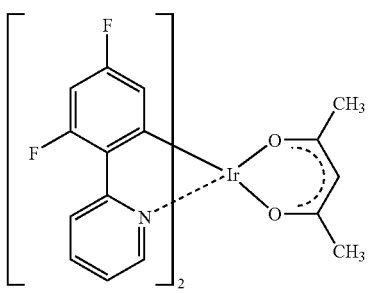
Ir-11
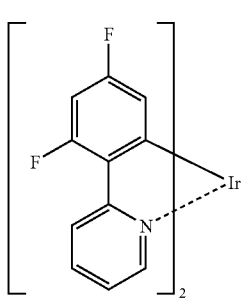
Ir-12
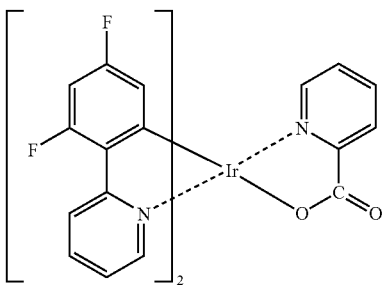

Ir-13 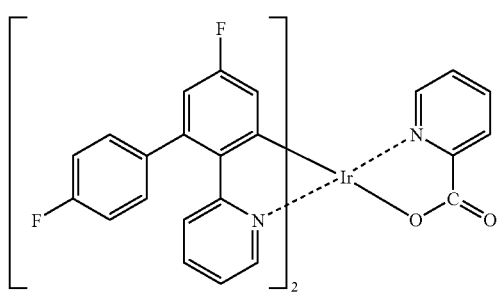
Pt-1 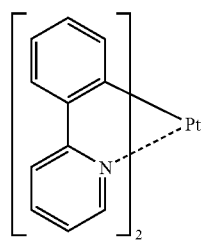
Pt-2 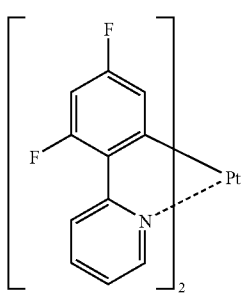
Pt-3 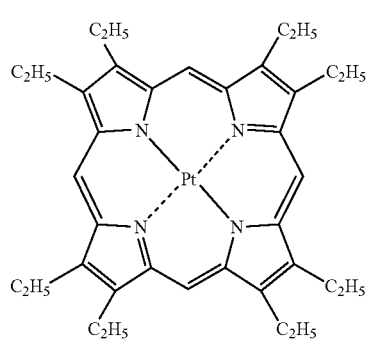
Pd-1 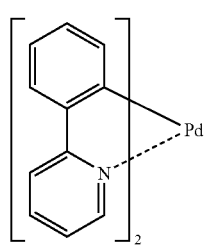
Pd-2 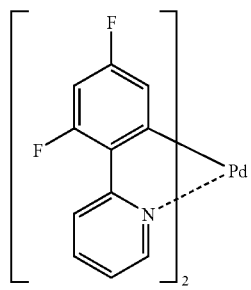
Pd-3 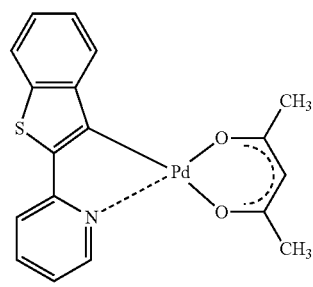
Rh-1 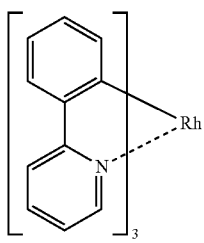
Rh-2 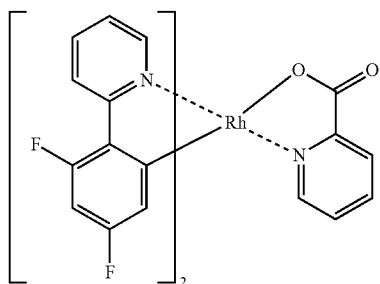
Rh-3 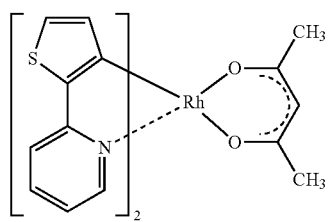

-continued

A-1
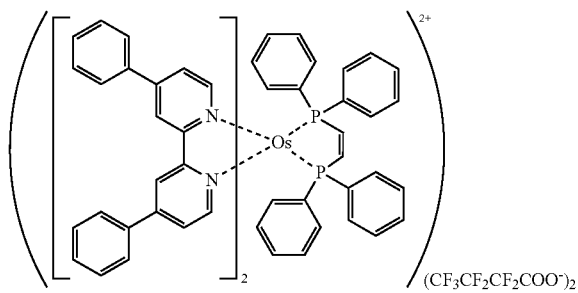

E-1
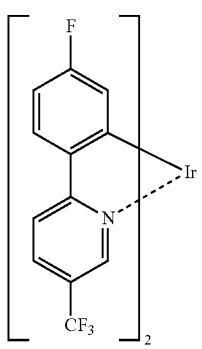

E-2
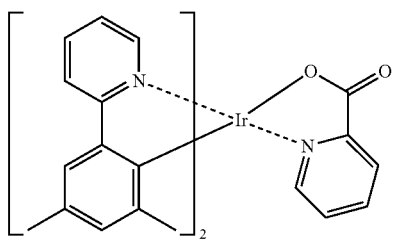

E-3
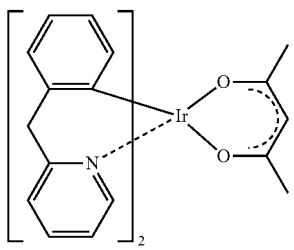

E-4
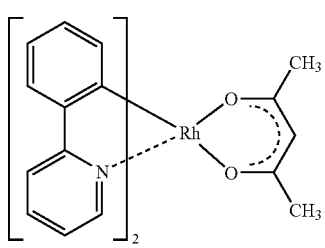

E-5
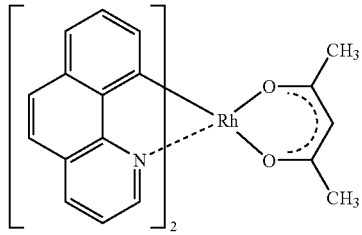

E-6
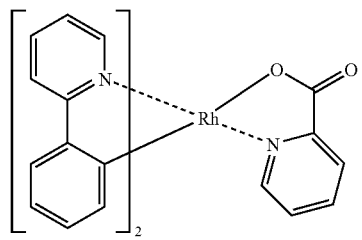

In the present invention, the wavelength of the phosphorescence maximum of the phosphorescent compound is not specifically limited. Theoretically, the phosphorescence wavelength can be varied by selecting a center metal, a ligand, or a substituent of the ligand. The phosphorescent compound preferably has a wavelength of the phosphorescence maximum in the wavelength region from 380 to 480 nm. Such an organic EL element emitting a blue or white light phosphorescence can provide higher emission efficiency.

Figure 4:
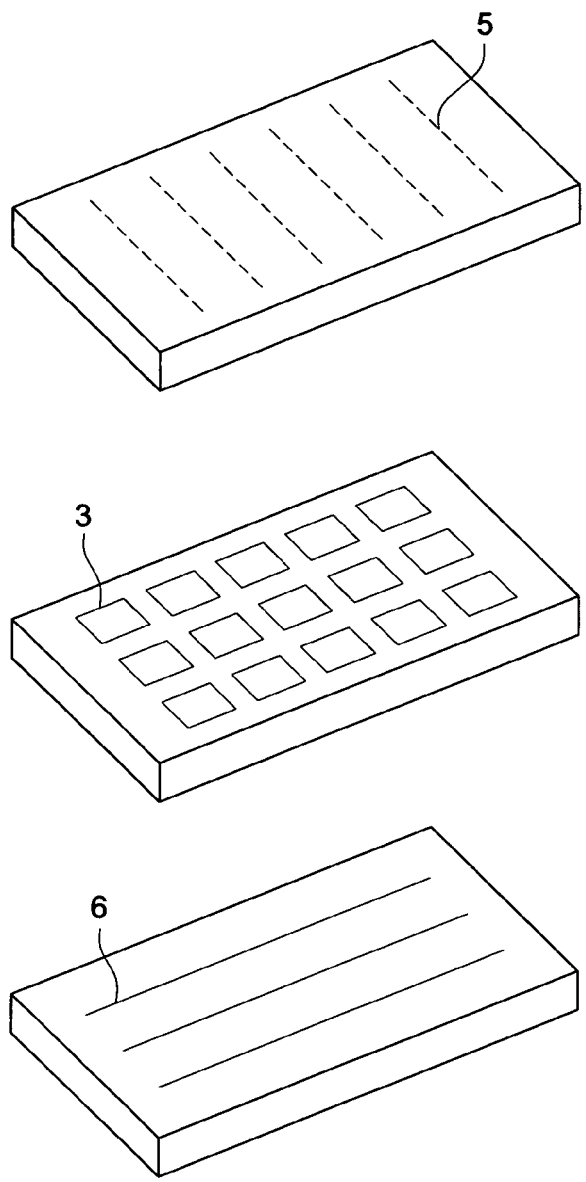
FIG. 4 is a view showing a passive matrix display.

Color of light emitted from the organic EL element or the compound of the present invention is measured by a spectral radiance meter CS-1000, manufactured by Konica Minolta Sensing Inc., and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai, 1985.

The light emitting layer can be formed employing the above-described compounds and a known method such as a vacuum deposition method, a spin coat method, a casting method, an LB method or an ink jet method. The thickness of the light emitting layer is not specifically limited, however, is ordinarily from 5 nm to 5 μm, and preferably from 5 to 200 nm. The light emitting layer may be composed of a single layer containing one or two or more of the phosphorescent compound or the host compound, or of plural layers containing the same composition or different composition.

<<Hole Transporting Layer>>

The hole transporting layer contains a material having a hole transporting ability, and in a broad sense a hole injecting layer or an electron blocking layer are included in a hole transporting layer.

The hole transporting layer may be either an organic substance or an inorganic substance as long as it has a hole injecting ability, a hole transporting ability or an ability to form a barrier to electrons. Examples thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline based copolymer, and an electroconductive oligomer, specifically a thiophene oligomer.

As the hole transporting material, those described above are used, however, a porphyrin compound, an aromatic tertiary amine compound or a styrylamine compound is preferably used, and, specifically, an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in JP-A No. 4-308688 such as 4,4',4''-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used. As the hole injecting material or the hole transporting material, inorganic compounds such as p-Si and p-SiC are usable.

The hole transporting layer can be formed by preparing a thin layer of the hole transporting material using a known method such as a vacuum deposition method, a spin coat method, a casting method, an ink jet method, or an LB method. The thickness of the hole transporting layer is not specifically limited, however, is ordinarily 5 to 5000 nm and preferably 5 to 200 nm. The hole transporting layer may be composed of a single layer structure containing one or two or more of the materials mentioned above.

<<Electron Transporting Layer>>

The electron transporting layer contains a material having an electron transporting ability, and in a broad sense an electron injecting layer or a hole blocking layer are included in an electron transporting layer. The electron transporting layer can be provided as a single layer or as plural layers.

An electron transporting material (which serves also as a hole blocking material) used in a single electron transporting layer or in the electron transporting layer closest to the cathode when plural electron transporting layers are employed, may be a compound which has a function of transporting electrons injected from a cathode to a light emitting layer. The material used in the electron transporting layer can be optionally selected from known compounds used as electron transporting materials. Examples of the material used in the electron transporting layer include a nitro-substituted fluorine derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are also usable as the electron transporting material. A polymer in which the material mentioned above is introduced in the polymer side chain or a polymer having the material as the polymer main chain can be also used.

A metal complex of an 8-quinolynol derivative such as aluminum tris(8-quinolynol) (Alq), aluminum tris(5,7-dichloro-8-quinolynol), aluminum tris(5,7-dibromo-8-quinolynol), aluminum tris(2-methyl-8-quinolynol), aluminum tris(5-methyl-8-quinolynol), or zinc bis(8-quinolynol) (Znq), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emitting layer may preferably be employed as the electron transporting material. An inorganic semiconductor such as n-Si and n-SiC may also be used as the electron transporting material in a similar way as in the hole transporting layer.

The electron transporting layer can be formed employing the above described electron transporting materials and a known method such as a vacuum deposition method, a spin coat method, a casting method, a printing method including an ink jet method or an LB method. The thickness of electron transporting layer is not specifically limited, however, is ordinarily 5 nm to 5 µm, and preferably 5 to 200 nm. The electron transporting layer may be composed of a single layer containing one or two or more of the electron transporting material.

<<Substrate>>

The organic EL element of the present invention is preferably provided on a substrate.

The substrate (also referred to as base plate, base or support) employed for the organic EL element of the present invention is not limited to specific kinds of materials such as glass and plastic, as far as it is transparent. Examples of the substrate preferably used include glass, quartz and light transmissible plastic film. Specifically preferred one is a resin film capable of providing flexibility to the organic EL element.

Examples of the resin film include films of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC), cellulose acetate propionate (CAP). The surface of the resin film may have a layer of an inorganic or organic compound or a hybrid layer of both compounds.

The external light emission efficiency (external quantum efficiency) of the organic EL element of the present invention is preferably not less than 1%, and more preferably not less than 5% at room temperature. Herein, external quantum yield (%) is represented by the following formula:

External quantum yield (%)=(the number of photons emitted to the exterior of the organic electroluminescent element×100)/(the number of electrons supplied to the organic EL element)

A hue improving filter such as a color filter may be used in combination or a color conversion filter which can convert emission light color from an organic EL element to multicolor employing a fluorescent compound may be used in combination. In the case where the color conversion filter is used, the λmax of the light emitted from the organic EL element is preferably not more than 480 nm.

<<Preparation of Organic EL Element>>

For one example, the preparation of the organic EL element, which has the following constitution will be described: Anode/Hole injecting layer/Hole transporting layer/Light emitting layer/Electron transporting layer/Electron injecting layer/Cathode.

A thin layer of a desired material for an electrode such as a material of the anode is formed on a suitable substrate by a vacuum deposition method or sputtering method to prepare the anode, so that the thickness of the layer is not more than 1 µm, and preferably within the range of from 10 to 200 nm. Then the hole injecting layer, the hole transporting layer, the light emitting layer, the electron transporting layer and the electron injecting layer, which constitute the organic EL element, are formed on the resulting anode as organic compound thin layers.

As methods for formation of the thin layers, as the same as described above, there are a vacuum deposition method and a wet process (for example, a spin coating method, a casting method, an ink jet method, and a printing method), however, a vacuum deposition method, a spin coating method, an ink jet method and a printing method are preferably used, since a uniform layer without a pinhole can be formed. Different methods may be used for formation of different layers. When the vacuum deposition method is used for the thin layer formation method, although conditions of the vacuum deposition differs due to kinds of materials used, vacuum deposition is preferably carried out at a boat temperature of from 50° C. to 450° C., at a degree of vacuum of from $10^{-6}$ to $10^{-2}$ Pa, at a deposition speed of from 0.01 to 50 nm/second, and at a substrate temperature of from −50 to 300° C. to form a layer with a thickness of from 0.1 nm to 5 µm, preferably from 5 to 200 nm.

After these layers has been formed, a thin layer of a material for a cathode is formed thereon to prepare a cathode, employing, for example, a vacuum deposition method or sputtering method to give a thickness of not more than 1 µm, and preferably from 50 to 200 nm. Thus, a desired organic EL element is obtained. It is preferred that the layers from the hole injecting layer to the cathode are continuously formed under one time of vacuuming to obtain an organic EL element. However, on the way of the layer formation under vacuum, a different layer formation method by taking the layer out of the vacuum chamber may be inserted. When the different method is used, the process is preferably carried out under a dry inert gas atmosphere.

In the multicolor display of the present invention, the light emitting layer only is formed using a shadow mask, and the other layers, besides the light emitting layer, are formed employing a vacuum deposition method, a casting method, a spin coat method or a printing method in which patterning employing the shadow mask is not required, since these layers are common to all the pixels. When the light emitting layer only is formed by patterning, the layer formation, although not specifically limited, is carried out preferably according to a vacuum deposition method, an ink jet method or a printing method. When a vacuum deposition method is used as the layer formation method, patterning of the layer is preferably carried out employing a shadow mask.

Further, the organic EL element can be prepared in the reverse order, in which the cathode, the electron injecting layer, the electron transporting layer, the light emitting layer, the hole transporting layer, the hole injecting layer, and the anode are formed in that order. When a direct current voltage of 2 to 40 V is applied to thus obtained multicolor display, setting the anode as a +polarity and the cathode as a −polarity, light emission occurs. An alternating current may also be applied to cause light emission. Arbitrary wave shape of alternating current may be used.

The display of the present invention can be used as a display device, a display, or various light emission sources. The display device or the display, which employs three kinds of organic EL elements emitting a blue light, a red light and a green light can present a full color image.

Examples of the display device or the display include a television, a personal computer, a mobile device or an AV device, a display for text broadcasting, and an information display used in a car. The display device may be used as specifically a display for reproducing a still image or a moving image. When the display device is used as a display for reproducing a moving image, the driving method may be either a simple matrix (passive matrix) method or an active matrix method.

Examples of an illuminator include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, however, are not limited thereto.

The organic EL element of the present invention may be an organic EL element having a resonator structure. The organic EL element having a resonator structure is applied to a light source for a photo-memory medium, a light source for an electrophotographic copier, a light source for an optical communication instrument, or a light source for a photo-sensor, however, its application is not limited thereto. In the above application, a laser oscillation may be carried out.

<<Display>>

The organic EL element of the present invention can be used as a lamp such as an illuminating lamp or a light source for exposure, as a projection device for projecting an image, or as a display for directly viewing a still image or a moving image. When the element is used in a display for reproducing a moving image, the driving method may be either a simple matrix (passive matrix) method or an active matrix method. The display can present a full color image by employing three or more kinds of organic EL elements each emitting light with a different color. A monochromatic color, for example, a white color can be converted to BGR colors to form a full color image, employing a color filter. Further, employing a color conversion filter, light color emitted from the organic EL element can be converted to another color or full color, where the λmax of the light emitted from the organic EL element is preferably not more than 480 nm.

One example of the display containing the organic EL element of the present invention will be explained below employing Figures.

FIG. 1 is a schematic drawing of one example of a display containing an organic EL element. FIG. 1 is a display such as that of a cellular phone, displaying image information due to light emission from the organic EL.

A display 1 contains a display section A having plural pixels and a control section B carrying out image scanning based on image information to display an image in the display section A.

The control section B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 2:
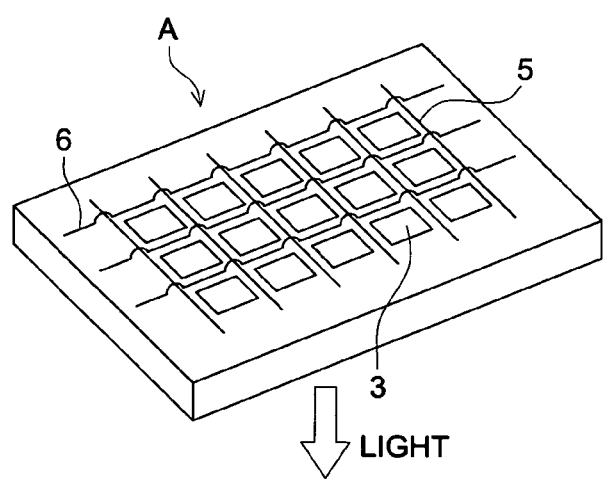
FIG. 2 is a view showing display section A.

FIG. 2 is a schematic drawing of a display section A.

The display section A contains a substrate, plural pixels 3, and a wiring section containing plural scanning lines 5 and plural data lines 6. The main members of the display section A will be explained below. In FIG. 2, light from pixels 3 is emitted in the direction of an arrow.

The plural scanning lines 5 and plural data lines 6 of the wiring section 2 each are composed of an electroconductive material, the lines 5 and the lines 6 being crossed with each other at a right angle, and connected with the pixels 3 at the crossed points (not illustrated).

The plural pixels 3, when the scanning signal is applied from the scanning lines 5, receive the data signal from the data lines 6, and emit light corresponding to the image data received. Provision of red light emitting pixels, green light emitting pixels, and blue light emitting pixels side by side on the same substrate can display a full color image.

Next, an emission process of pixels will be explained.

Figure 3:
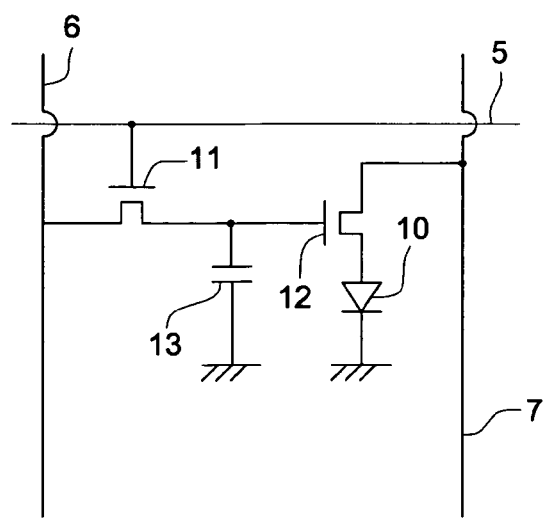
FIG. 3 illustrates an equivalent circuit of a driving circuit which drives a pixel.

FIG. 3 is a schematic drawing of a pixel.

The pixel contains an organic EL element 10, a switching transistor 11, a driving transistor 12, and a capacitor 13. When a pixel with a red light emitting organic EL element, a pixel with a green light emitting organic EL element, and a pixel with a blue light emitting organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, or emission due to on-off according to a binary value of the image data signals.

The electric potential of the capacitor 13 may maintain till the next application of the scanning signal, or may be discharged immediately before the next scanning signal is applied.

In the present invention, light emission may be carried out employing a passive matrix method as well as the active matrix method as described above. The passive matrix method is one in which light is emitted from the organic EL element according to the data signal only when the scanning signals are scanned.

FIG. 4 is a schematic drawing of a display employing a passive matrix method. In FIG. 4, pixels 3 are provided between the scanning lines 5 and the data lines 6, crossing with each other.

When scanning signal is applied to scanning line 5 according to successive scanning, pixel 3 connecting the scanning line 5 emits according to the image data signal. The passive matrix method has no active element in the pixel 3, which reduces manufacturing cost of a display.

The materials of the present invention are also applicable to an organic EL element substantially emitting white light. White light is obtained by mixing plural colors by simultaneously emitting plural colors from plural light emitting materials. Examples of a combination of colors to obtain white light include: a combination containing three maximum emission wavelengths of three primary colors, namely, blue, green and red; and a combination containing a pair of maximum emission wavelengths of two complementary colors, for example, blue-yellow and blue green-orange.

A combination for obtaining plural color lights may be a combination of materials emitting fluorescence or phosphorescence (emitting dopants), or a combination of light emitting materials emitting fluorescence or phosphorescence, and colorants which emit light by absorbing light emitted from those light emitting-materials as excitation light. For an organic EL element emitting white light of the present invention, preferable is a combination of plural light emitting dopants.

Examples of a layer constitution to obtain plural color lights include: a method to incorporate plural emitting dopants in an emitting layer; a method to provide plural emitting layers and emitting dopants having different emission wavelengths are incorporated one by one in each emitting layer; and a method to provide matrix-arrayed minute pixels each having different emission wavelength.

In the preparation process of the white light emitting organic EL element of the present invention, patterning may be carried out while forming each layer, if necessary, for example, by using a metal mask or by inkjet printing. Patterning may be carried out: only for electrodes, for electrodes and a light emitting layer, or for all the constituting layers.

Materials used for the light emitting layer are not specifically limited, and, for example, in the case of preparing a backlight of a liquid crystal display, arbitrary materials may be selected and combined from known light emitting materials including the iridium complexes or platinum complexes of the present invention to generate white light emission adjust the wavelength range corresponding to the CF (color filter) property.

The white light emitting organic EL element of the present invention may be utilized as various light sources or an illuminator, for example, as a kind of lamp such as a home lamp, a room lamp in a car, or a developing lamp, or for a display such as a backlight for a liquid crystal display.

It is also usable for a wide range of application, for example, as a backlight for a watch, a light source for boarding advertisement, a signal device, a light source for a photo memory medium, a light source for an electrophotographic copier, a light source for an optical communication instrument or a light source for an optical sensor, or in electric home appliances using a display.

EXAMPLES

The present invention will now be explained using examples, however, the present invention is not limited thereto.

Example 1

Preparation of Organic EL Element 1-1

A pattern was formed on a substrate (100 mm×100 mm×1.1 mm) composed of a glass plate and a 100 nm ITO (indium tin oxide) layer (NA45 manufactured by NH Technoglass Co., Ltd.) as an anode. Then the resulting transparent substrate having the ITO transparent electrode was subjected to ultrasonic washing in i-propyl alcohol, dried with a dry nitrogen gas and subjected to UV-ozone cleaning for 5 minutes. Thus obtained transparent substrate was fixed on a substrate holder of a vacuum deposition (evaporation) apparatus available on the market. Further, 200 mg of α-NPD was placed in a first resistive heating molybdenum boat, 200 mg of CBP as a host material was put in a second resistive heating molybdenum boat, 200 mg of bathocuproine (BCP) was placed in a third resistive heating molybdenum boat, 100 mg of D-1 was placed in a fourth resistive heating molybdenum boat, and 200 mg of $Alq_3$ was placed in a fifth resistive heating molybdenum boat. The resulting boats were set in the vacuum deposition apparatus.

The pressure in the vacuum tank was reduced to $4\times10^{-4}$ Pa. Then, the boat carrying α-NPD being heated by supplying an electric current to the boat, α-NPD was deposited onto the transparent substrate at a depositing rate of 0.1 nm/sec to form a hole transporting layer of a thickness of 40 nm. After that, the boat carrying CBP and the boat carrying D-1 being heated by supplying an electric current to both boats, CBP at a depositing rate of 0.2 nm/sec and D-1 at a depositing rate of 0.012 nm/sec were co-deposited onto the resulting hole transporting layer to form a light emitting layer of a thickness of 40 nm. The temperature of the substrate at the time of the deposition was room temperature. Subsequently, the boat carrying BCP being heated by supplying an electric current to the boat, BCP was deposited onto the resulting light emitting layer at a depositing speed of 0.1 nm/sec to form an electron transporting layer which also worked as a hole blocking layer of a thickness of 10 nm. Further, the boat carrying $Alq_3$ being heated by supplying an electric current to the boat, $Alq_3$ was deposited onto the resulting electron transporting layer at a depositing rate of 0.1 nm/sec to form an electron injecting layer of a thickness of 40 nm. The temperature of the substrate at the time of the deposition was room temperature.

After that, a 0.5 nm thick lithium fluoride layer and a 110 nm thick aluminum layer were deposited on the resulting material to form a cathode. Thus, Organic EL Element 1-1 was prepared.

Preparation of Organic EL Elements 1-2 to 1-20

Organic EL Elements 1-2 to 1-20 were prepared in the same manner as Organic EL Element 1-1, except that CBP used as a host compound of the emitting layer in Organic EL Element 1-1 was replaced with the compounds listed in Table 1 and that D-1 used as an emission dopant of the emitting layer in Organic EL Element 1-1 was replaced with the compounds listed in Table 1. The structures of the compounds used above are shown below:

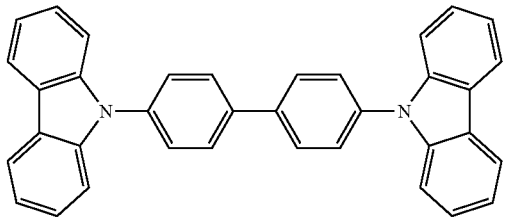

CBP

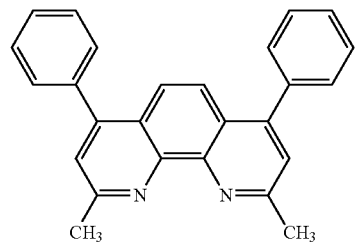

BCP

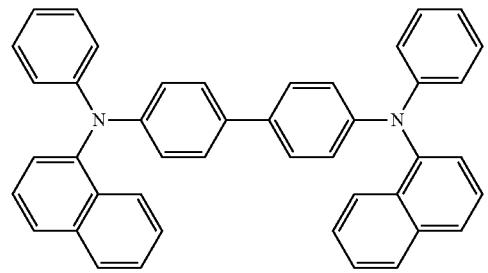

α-NPD

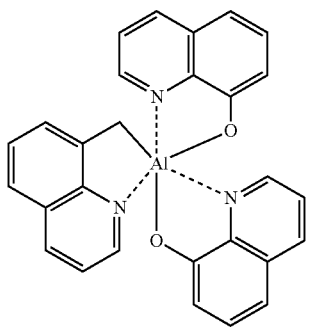

$Alq_3$

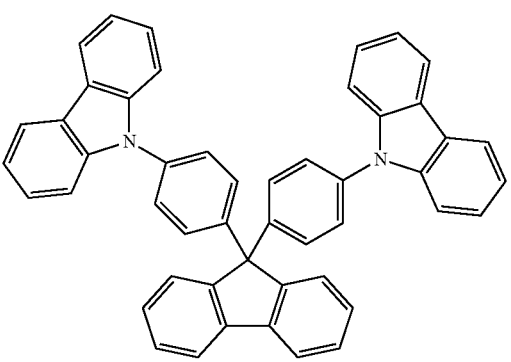

Comparative 1

Evaluation of Organic EL Elements 1-1 to 1-20

Organic EL Elements 1-1 to 1-20 were evaluated in the manner described below, and the results were summarized in Table 1.

(External Quantum Efficiency)

Electric current of 2.5 mA/cm² was supplied to each sample at 23° C. in an atmosphere of a dry nitrogen gas, and the external quantum efficiency (%) of each sample was measured. The external quantum efficiency (%) was calculated from the date obtained by being measured through a spectral radiance meter CS-1000 produced by Konica Minolta Sensing Inc. The results of external quantum efficiency measurements in Table 1 were given as relative values when the value of external quantum efficiency of Organic EL Element 1-1 was set to 100.

(Life)

A period in which an initial emission intensity of an organic EL element decreased to half of it was defined as a half-life period (τ0.5) and used as an index of the life of an organic EL element, the emission intensity being measured by supplying a constant electric current of 2.5 mA/cm² at 23° C. in an atmosphere of a dry nitrogen gas. A spectral radiance meter CS-1000 produced by Konica Minolta Sensing Inc. was used for the measurement of the life of an organic EL element. The results of life measurements in Table 1 were given as relative values when the value of life of Organic EL Element 1-1 was set to 100.

TABLE 1

| Organic EL Element | Host Compound | Guest Compound | External Quantum Efficiency | Life | Remarks |
| --- | --- | --- | --- | --- | --- |
| 1-1 | CBP | D-1 | 100 | 100 | Comparative |
| 1-2 | CBP | D-3 | 98 | 101 | Comparative |
| 1-3 | H-1 | D-1 | 165 | 129 | Inventive |
| 1-4 | H-1 | D-2 | 163 | 120 | Inventive |
| 1-5 | H-1 | D-3 | 155 | 125 | Inventive |
| 1-6 | H-1 | D-25 | 147 | 115 | Inventive |
| 1-7 | H-1 | D-40 | 144 | 123 | Inventive |
| 1-8 | H-1 | D-48 | 150 | 145 | Inventive |
| 1-9 | H-1 | D-49 | 148 | 151 | Inventive |
| 1-10 | H-8 | D-1 | 178 | 119 | Inventive |
| 1-11 | H-8 | D-2 | 180 | 120 | Inventive |
| 1-12 | H-8 | D-3 | 171 | 130 | Inventive |
| 1-13 | H-8 | D-48 | 159 | 139 | Inventive |
| 1-14 | H-8 | D-49 | 155 | 145 | Inventive |
| 1-15 | H-12 | D-1 | 160 | 138 | Inventive |
| 1-16 | H-12 | D-49 | 162 | 140 | Inventive |
| 1-17 | H-13 | D-1 | 161 | 128 | Inventive |
| 1-18 | H-13 | D-49 | 159 | 139 | Inventive |
| 1-19 | Comparative 1 | Ir-12 | 150 | 51 | Comparative |
| 1-20 | H-1 | Ir-12 | 160 | 67 | Comparative |

The results shown in Table 1 revealed that the organic EL elements of the present invention exhibits high external quantum efficiencies and long lives.

Example 2

A 20 mm×20 mm pattern of transparent electrode was formed on the transparent substrate of Example 1, on which 50 nm thickness of α-NPD was formed as a hole injection/transport layer as described in Example 1, and a 30 nm thickness of a light emitting layer was formed, which was prepared as follows: a boat carrying H-1, a boat carrying D-1 and a boat carrying Ir-9 were independently heated by supplying an electric current so that the ratio of depositing rates of H-1: D-1: Ir-9 were adjusted to 100:5:0.6.

Subsequently, 10 nm of BCP was formed as an electron transport layer and 40 nm of Alq₃ was formed as an electron injecting layer.

Then, the vacuum tank was opened and a stainless steel mask having a square hole of almost the same dimension as the transparent electrode was placed on the electron injecting layer to form 0.5 nm thickness of lithium fluoride as a cathode buffer layer and 110 nm of aluminum as a cathode, by vacuum evaporation (vacuum deposition).

Figure 5:
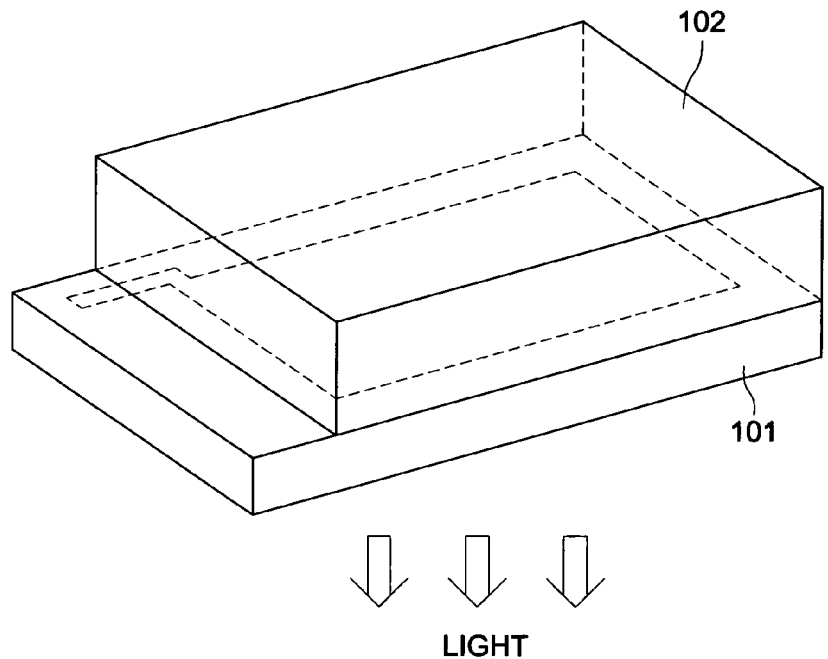
FIG. 5 is a schematic illustration of an illuminator.
Figure 6:
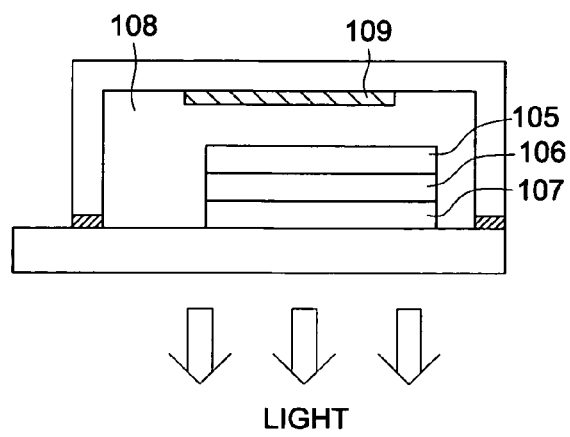
FIG. 6 is a cross-section view showing an illuminator.

A plane lamp was prepared by sealing the organic EL element as shown in FIGS. 5 and 6. When the lamp was turned on, emission of almost white light was observed, showing that the plane lamp of the present invention is applicable as an illuminator. When the host compound was changed to other compound of the present invention, similarly, emission of white light was observed. In FIGS. 5 and 6, 101 represents a transparent substrate, 102 represents a glass cover, 105 represents a cathode, 106 represents an organic EL layer, 107 represents a substrate having a transparent electrode, 108 represents nitrogen gas and 109 represents a dessicant.

Example 3

Preparation of Full Color Display (Preparation of Blue Light Emitting Element)

Organic EL element 1-3 was used as a blue light emitting element.

(Preparation of Green Light Emitting Element)

A green light emitting element was prepared in the same manner as Organic EL element 1-3 except that CBP was used as a host compound and Ir-1 was used as a dopant.

(Preparation of Red Light Emitting Element)

A red light emitting element was prepared in the same manner as Organic EL element 1-3 except that CBP was used as a host compound and Ir-9 was used as a dopant.

The above red, green and blue light emitting organic EL elements were juxtaposed on the same substrate to prepare a full color display driven by an active matrix method, illustrated in FIG. 1. In FIG. 2, a schematic drawing of only display section A is shown. Namely, on the same substrate, a wiring section containing plural scanning lines 5 and plural data lines 6, and juxtaposed plural pixels 3 (pixels emitting red light, pixels emitting green light and pixels emitting blue light) are provided. The plural scanning lines 5 and plural data lines 6 of the wiring section are composed of an electroconductive material. The scanning lines 5 and the data lines 6 are crossing with each other at a right angle to form a lattice, and connected to the pixels 3 at the crossed points (not illustrated). The plural pixels 3 are driven by an active matrix method in which each pixel contains an organic EL element emitting a corresponding color light and active elements including a switching transistor and a driving transistor. When scanning signals are applied through the scanning lines 5, image data signals are received through data lines 6, and emission occurs according to the received image data. By juxtaposing red light emitting pixels, green light emitting pixels, and blue light emitting pixels side by side on the same substrate, a full color display is prepared.

By driving the full color display, it was found that a bright full color-moving picture with high luminance, and long life was obtained.

Example 4

Preparation of Illuminator

An illuminator was prepared by covering each non-emitting surface of the organic EL elements emitting blue light, green light and red light with a glass case. Thus prepared illuminator was found to be a thin film white light emitting illuminator exhibiting high emission efficiency and long life. FIG. 5 shows a schematic illustration of the illuminator, and FIG. 6 shows a cross-section of the illuminator. Organic EL element 101 was covered with glass cover 102.

105 represents a cathode, 106 represents an organic EL layer, 107 represents a glass substrate having a transparent electrode. Inside glass cover 102 is filled with nitrogen gas 108 and desiccant 109 is provided.

The range of color reproducibility was evaluated by using the organic EL element of the present invention in combination with a commercially available color filter for a display, and it was found that a wide range of color reproducibility was observed, indicating that the organic EL element of the present invention exhibits an excellent property in color reproducibility.

What is claimed is:

1. An organic electroluminescent element comprising an anode and a cathode having therebetween a light emitting layer, wherein the light emitting layer comprises a guest compound represented by one of Formulae (A-1) through (A-9) and a host compound represented by Formula (1):

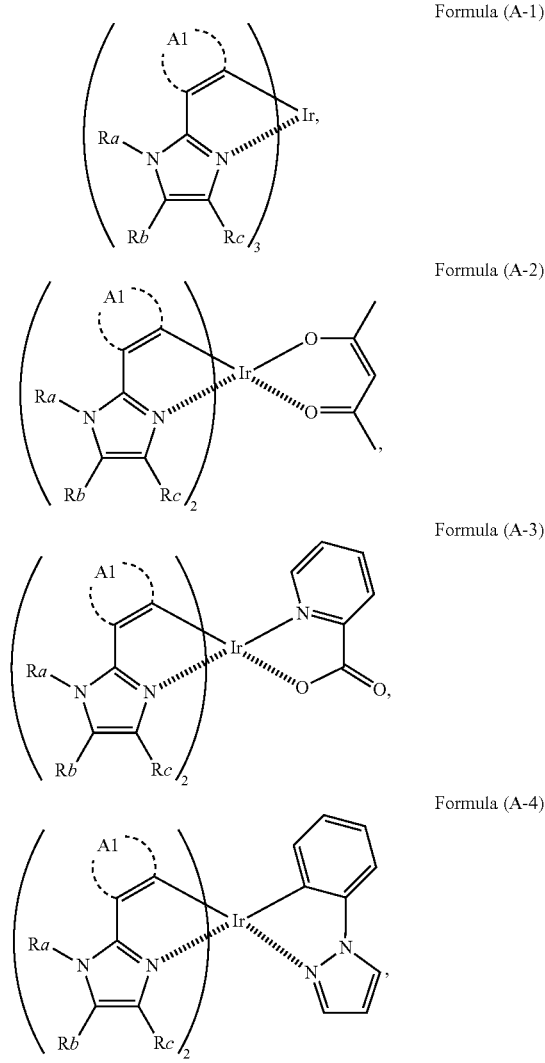

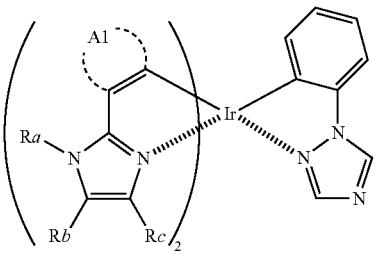

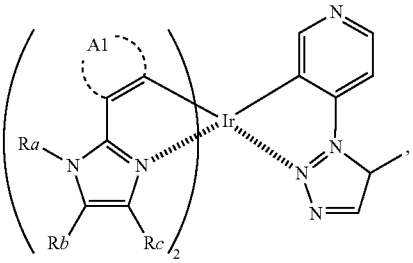

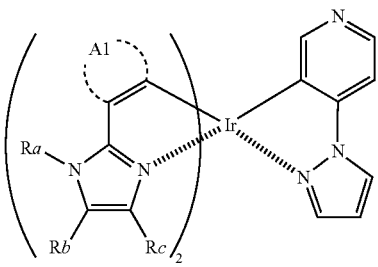

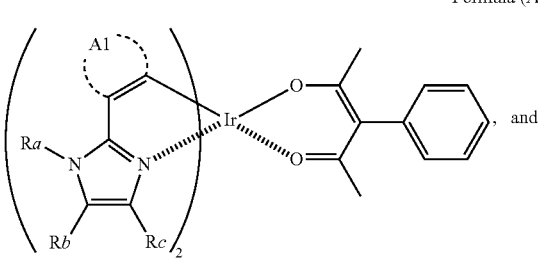

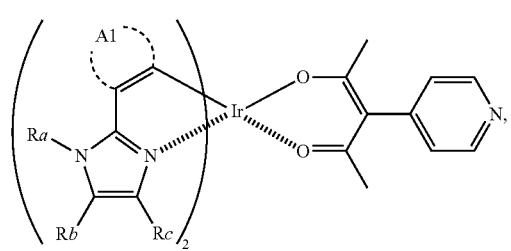

wherein Ra represents an alkyl group, an aromatic hydrocarbon group or a heteroaromatic group, Rb and Rc each represent a hydrogen atom or a substituent selected from the group consisting of an alkyl group, an aromatic hydrocarbon group, an alkoxy group and a halogen atom; A1 represents a benzene ring or a pyridine ring;

wherein a plurality of A1 are the same or different, a plurality of Ra are the same or different, a plurality of Rb are the same or different and a plurality of Rc are the same or different, in each of Formulae (A-1) through (A-9);

Formula (1)

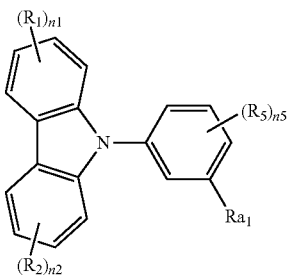

wherein $Ra_1$ represents a phenyl group; $R_1$ and $R_2$ each represent a phenyl group or a pyridyl group; $R_5$ represents a substituent selected from Group 1; and n1, n2 and n5 each represent an integer of 0 to 4, wherein the Group 1 substituent is selected from the group consisting of an alkyl group, a cycloalkyl group, an alkenyl group, an alkynyl group, an aromatic hydrocarbon group, an aromatic heterocycle group, a heterocycle group, an alkoxy group, a cycloalkoxyl group, an aryloxy group, an alkylthio group, a cycloalkylthio group, an arylthio group, an alkoxycarbonyl group, an aryloxycarbonyl group, a sulfamoyl group, an acyl group, an acyloxy group, an amide group, a carbamoyl group, an ureido group, a sulfinyl group, an alkylsulfonyl group, an arylsulfonyl group, an amino group, a halogen atom, a hydrofluorocarbon group, a cyano group, a nitro group, a hydroxyl group, a mercapto group and a silyl group.

2. The organic electroluminescent element of claim 1, wherein the aromatic hydrocarbon ring represented by A1 in any one of Formula (A-1) through (A-9) is a benzene ring.

3. The organic electroluminescent element of claim 1 which emits blue light.

4. The organic electroluminescent element of claim 1 which emits white light.

5. A display comprising the organic electroluminescent element of claim 1.

6. An illuminator comprising the organic electroluminescent element of claim 1.

7. A display comprising the illuminator of claim 6 and a liquid crystal cell as a display means.

8. The organic electroluminescent element of claim 1, wherein $R_5$ in Formula (1) represents an aromatic hydrocarbon group or an aromatic heterocycle group.

9. An organic electroluminescent element comprising an anode and a cathode having therebetween a light emitting layer, wherein the light emitting layer comprises a guest compound represented by one of Formula (B-1) through (B-3) and a host compound represented by Formula (1):

Formula (B-1)

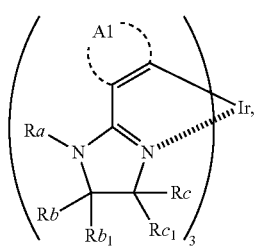

Formula (B-2)

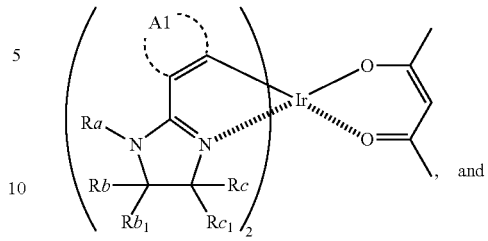

, and

Formula (B-3)

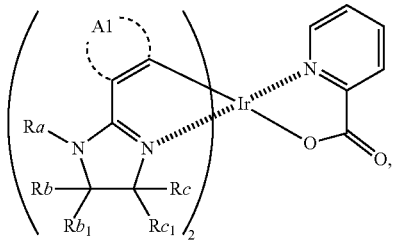

wherein Ra represents an alkyl group or an aromatic hydrocarbon group; Rb, Rc, $Rb_1$ and $Rc_1$ each represent a hydrogen atom; A1 represents a benzene ring; M represents Ir;

Formula (1)

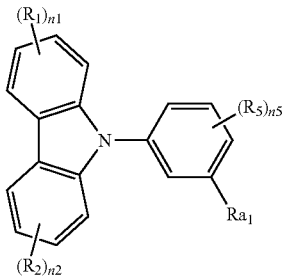

wherein $Ra_1$ represents a phenyl group; $R_1$ and $R_2$ each represent a phenyl group or a pyridyl group, $R_5$ represents a substituent selected from Group 1; and n1, n2 and n5 each represent an integer of 0 to 4, wherein the Group 1 substituent is selected from the group constituting of an alkyl group, a cycloalkyl group, an alkenyl group, an alkynyl group, an aromatic hydrocarbon group, an aromatic heterocycle group, a heterocycle group, an alkoxy group, a cycloalkoxyl group, an aryloxy group, an alkylthio group, a cycloalkylthio group, an arylthio group, an alkoxycarbonyl group, an aryloxycarbonyl group, a sulfamoyl group, an acyl group, an acyloxy group, an amide group, a carbamoyl group, an ureido group, a sulfinyl group, an alkylsulfonyl group, an arylsulfonyl group, an amino group, a halogen atom, a hydrofluorocarbon group, a cyano group, a nitro group, a hydroxyl group, a mercapto group and a silyl group.

10. An organic electroluminescent element comprising an anode and a cathode having therebetween a light emitting layer, wherein the light emitting layer comprises a guest compound represented by one of Formulae (C-1) through (C-3) and a host compound represented by Formula (I):

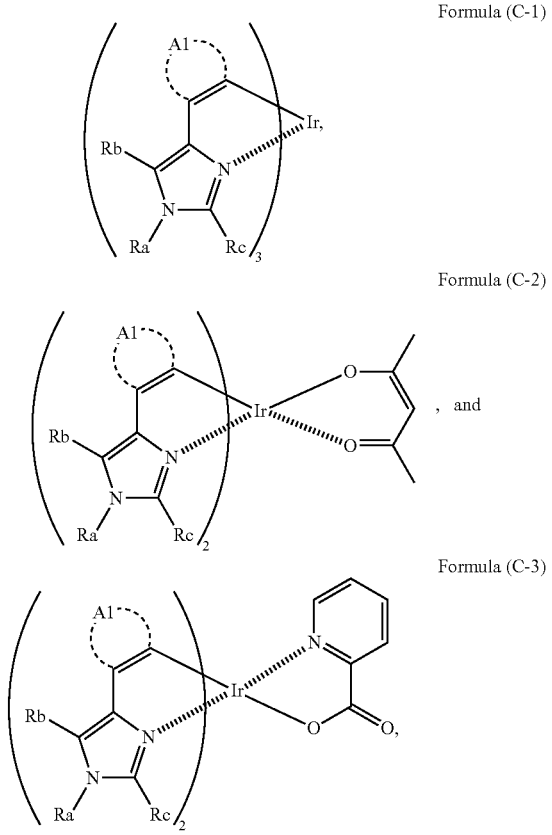

Formula (C-1)

Formula (C-2), and

Formula (C-3)

wherein Ra represents an alkyl group or an aromatic hydrocarbon group; Rb, and Rc each represent a hydrogen atom or an alkyl group; A1 represents a benzene ring; M represents Ir;

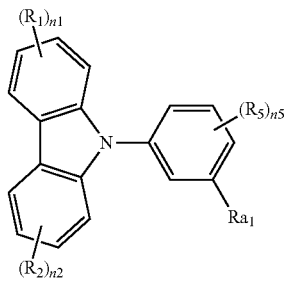

Formula (1)

wherein $Ra_1$ represents a phenyl group; $R_1$ and $R_2$ each represent a phenyl group or a pyridyl group, $R_5$ represents a substituent selected from Group 1; and n1, n2 and n5 each represent an integer of 0 to 4, wherein the Group 1 substituent is selected from the group consisting of an alkyl group, a cycloalkyl group, an alkenyl group, an alkynyl group, an aromatic hydrocarbon group, an aromatic heterocycle group, a heterocycle group, an alkoxy group, a cycloalkoxyl group, an aryloxy group, an alkylthio group, a cycloalkylthio group, an arylthio group, an alkoxycarbonyl group, an aryloxycarbonyl group, a sulfamoyl group, an acyl group, an aryloxy group, an amide group, a carbamoyl group, an ureido group, a sulfinyl group, an alkylsulfonyl group, an arylsulfonyl group, an amino group, a halogen atom, a hydrofluorocarbon group, a cyano group, a nitro group, a hydroxyl group, a mercapto group and a silyl group.

11. The organic electroluminescent element of claim 10, wherein $R_5$ in Formula (1) represents an aromatic hydrocarbon group or an aromatic heterocycle group.

* * * * *